United States Patent
Lee et al.

(10) Patent No.: US 11,758,801 B2
(45) Date of Patent: Sep. 12, 2023

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Hyoyoung Lee, Suwon-si (KR); Hankyu Pak, Suwon-si (KR); Taeil Kim, Asan-si (KR); Sun Young Pak, Suwon-si (KR); Jang Yeol Baek, Yongin-si (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 17/176,714

(22) Filed: Feb. 16, 2021

(65) Prior Publication Data
US 2021/0391540 A1    Dec. 16, 2021

(30) Foreign Application Priority Data

Jun. 11, 2020    (KR) .................. 10-2020-0070836

(51) Int. Cl.
*H01L 51/00* (2006.01)
*H10K 85/30* (2023.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
CPC ................ H10K 85/322; C07F 5/027; C09K 2211/1018
See application file for complete search history.

(56) References Cited

U.S. PATENT DOCUMENTS 10,374,166 B2    8/2019    Hatakeyama et al.
2019/0058124 A1    2/2019    Hatakeyama et al.
(Continued)

FOREIGN PATENT DOCUMENTS

EP          3 843 168 A1    6/2021
KR    10-2016-0119683 A    10/2016
(Continued)

OTHER PUBLICATIONS

Pershin, Anton et al., "Highly emissive excitons with reduced exchange energy in thermally activated delayed fluorescent molecules", Nature Communications, vol. 10, 597, 2019, 5pp.

*Primary Examiner* — Alexander C Kollias
(74) *Attorney, Agent, or Firm* — Lewis Roca Rothgerber Christie LLP

(57) ABSTRACT

An organic electroluminescence device of an embodiment includes a first electrode facing a second electrode, and a plurality of organic layers between the first electrode and the second electrode, wherein at least one organic layer among the plurality of organic layers includes a fused polycyclic compound represented by Formula 1 below, thereby showing improved emission efficiency.

Formula 1

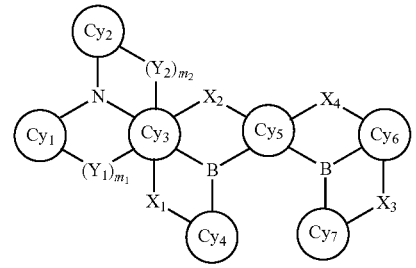

20 Claims, 2 Drawing Sheets

(51) Int. Cl.
*C07F 5/02* (2006.01)
*C09K 11/06* (2006.01)
*H10K 50/11* (2023.01)
*H10K 50/15* (2023.01)
*H10K 50/16* (2023.01)
*H10K 50/17* (2023.01)
*H10K 101/10* (2023.01)

(52) U.S. Cl.
CPC ...... *C09K 2211/1018* (2013.01); *H10K 50/11* (2023.02); *H10K 50/15* (2023.02); *H10K 50/16* (2023.02); *H10K 50/17* (2023.02); *H10K 2101/10* (2023.02)

(56) References Cited

U.S. PATENT DOCUMENTS

| | | |
|---|---|---|
| 2019/0375768 A1 | 12/2019 | Kim et al. |
| 2020/0044159 A1 | 2/2020 | Yamatani |
| 2020/0052212 A1 | 2/2020 | Tasaki et al. |
| 2020/0190115 A1 | 6/2020 | Hatakeyama et al. |
| 2020/0203651 A1* | 6/2020 | Duan .................. H10K 85/654 |
| 2020/0395553 A1* | 12/2020 | Park .................. H10K 85/6576 |
| 2020/0411771 A1* | 12/2020 | Kim .................... H10K 85/626 |
| 2022/0037591 A1* | 2/2022 | Hatakeyama ........ H10K 85/151 |

FOREIGN PATENT DOCUMENTS

| | | |
|---|---|---|
| KR | 10-2018-0108604 A | 10/2018 |
| KR | 10-2019-0114999 A | 10/2019 |
| KR | 10-2019-0132645 A | 11/2019 |
| KR | 10-2019-0141052 A | 12/2019 |
| KR | 10-2058028 B1 | 12/2019 |
| WO | WO 2018/212169 A1 | 11/2018 |
| WO | WO 2020/039930 A1 | 2/2020 |

* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0070836, filed on Jun. 11, 2020, the entire contents of which are hereby incorporated by reference.

FIELD

Embodiments of the present disclosure herein relate to an organic electroluminescence device and a fused polycyclic compound used therein, and, for example, to a fused polycyclic compound used as a light-emitting material and an organic electroluminescence device including the same.

BACKGROUND

Recently, the development of an organic electroluminescence display as an image display is being actively conducted. Different from a liquid crystal display, the organic electroluminescence display may be referred to as a self-luminescent display in which holes and electrons injected from a first electrode and a second electrode recombine in an emission layer, and a light-emitting material including an organic compound in the emission layer emits light to attain display.

In the application of an organic electroluminescence device to a display, the decrease of the driving voltage, and the increase of the emission efficiency and the life of the organic electroluminescence device are beneficial, and development on materials for an organic electroluminescence device stably attaining the requirements is continuously being researched.

Recently, in order to accomplish an organic electroluminescence device having high efficiency, techniques for phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

SUMMARY

Embodiments of the present disclosure provide an organic electroluminescence device having improved emission efficiency.

Embodiments of the present disclosure also provide a fused polycyclic compound capable of improving the emission efficiency of an organic electroluminescence device.

An organic electroluminescence device according to an embodiment of the present disclosure includes a first electrode, a second electrode facing the first electrode, and a plurality of organic layers between the first electrode and the second electrode, wherein at least one organic layer among the plurality of organic layers includes a fused polycyclic compound represented by the following Formula 1, and at least one organic layer among the plurality of organic layers includes an amine compound represented by the following Formula a:

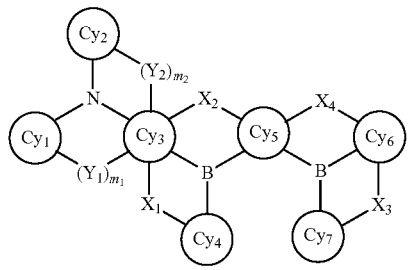

Formula 1 in Formula 1, $Cy_1$ to $Cy_7$ are each independently a substituted or unsubstituted aromatic hydrocarbon ring, or a substituted or unsubstituted aromatic heterocycle, $X_1$ to $X_4$ are each independently $NR_a$, O or S, $R_a$ is a substituted or unsubstituted alkyl group of 1 to 20 carbon atom, a substituted or unsubstituted aryl group of 6 to 60 ring-forming carbon atoms, or a substituted or unsubstituted heteroaryl group of 2 to 60 ring-forming carbon atoms, $Y_1$ and $Y_2$ are each independently $BAr_1$, $Ar_1$ is a substituted or unsubstituted aryl group of 6 to 60 ring-forming carbon atoms, or a substituted or unsubstituted heteroaryl group of 2 to 60 ring-forming carbon atoms, and $m_1$ and $m_2$ are each independently 0 or 1, where at least one selected from among $m_1$ and $m_2$ is 1,

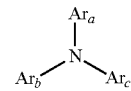

Formula a in Formula a, $Ar_a$ to $Ar_c$ are each independently a substituted or unsubstituted aryl group of 6 to 60 ring-forming carbon atoms, or a substituted or unsubstituted heteroaryl group of 2 to 60 ring-forming carbon atoms.

In an embodiment, the plurality of organic layers may include a hole transport region on the first electrode, an emission layer on the hole transport region, and an electron transport region on the emission layer, and the emission layer may include the fused polycyclic compound represented by Formula 1 above.

In an embodiment, the emission layer may emit delayed fluorescence.

In an embodiment, the emission layer may be a delayed fluorescence emission layer including a host and a dopant, and the dopant may include the fused polycyclic compound represented by Formula 1 above.

In an embodiment, the emission layer may be a delayed fluorescence emission layer including a host and a dopant, and the host may include the fused polycyclic compound represented by Formula 1 above.

In an embodiment, the hole transport region may include a hole injection layer on the first electrode, and a hole transport layer on the hole injection layer, and the hole transport layer may include the amine compound represented by Formula a above.

In an embodiment, the organic electroluminescence device may further include a capping layer on the second electrode and having a refractive index of about 1.6 or more.

In an embodiment, the fused polycyclic compound represented by Formula 1 above may be represented by the following Formula 2:

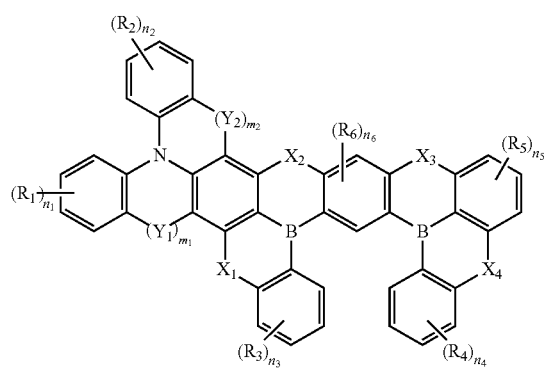

Formula 2 in Formula 2, $R_1$ to $R_6$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring, $n_1$ to $n_4$ are each independently an integer in a range of 0 to 4, $n_5$ is an integer in a range of 0 to 3, $n_6$ is an integer in a range of 0 to 2, and $X_1$ to $X_4$, $Y_1$, $Y_2$, $R_a$, $Ar_1$, $m_1$ and $m_2$ are the same as defined in Formula 1 above.

In an embodiment, the fused polycyclic compound represented by Formula 1 above may be represented by the following Formula 3-1 to Formula 3-3:

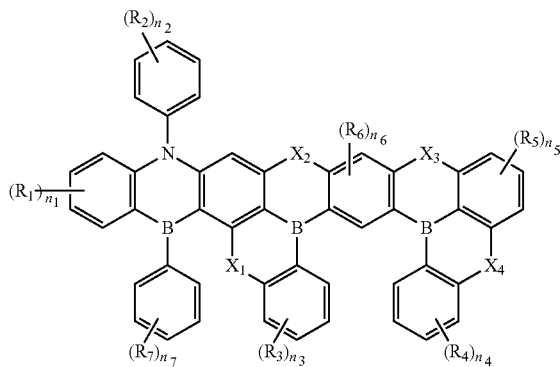

Formula 3-1

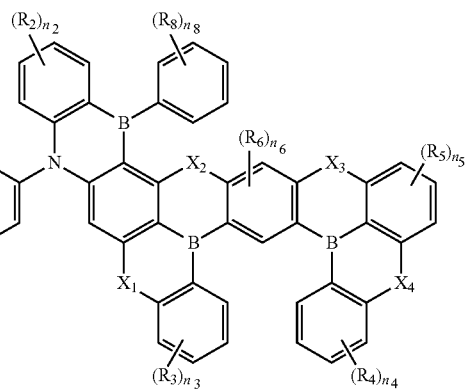

Formula 3-2

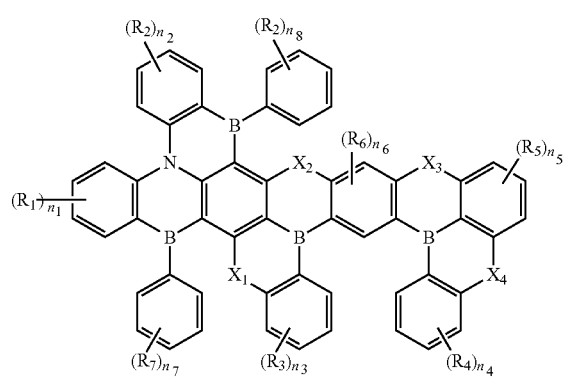

Formula 3-3 in Formula 3-1 to Formula 3-3, $R_7$ and $R_8$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring, $n_7$ and $n_8$ are each independently an integer in a range of 0 to 5, and $X_1$ to $X_4$, $R_a$, $R_1$ to $R_6$, and $n_1$ to $n_6$ are the same as defined in Formula 1 and Formula 2 above.

In an embodiment, the fused polycyclic compound represented by Formula 1 above may be represented by the following Formula 4-1 to Formula 4-6:

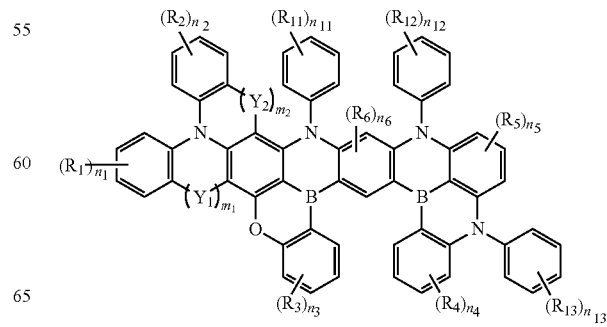

Formula 4-1

Formula 4-2

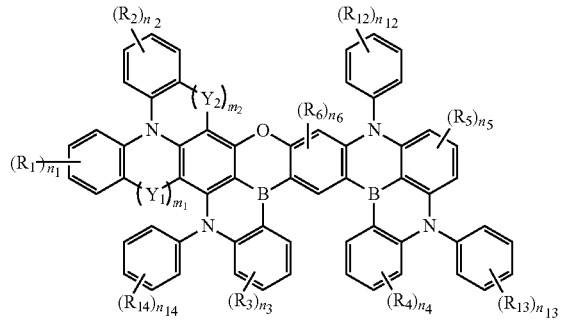

Formula 4-6

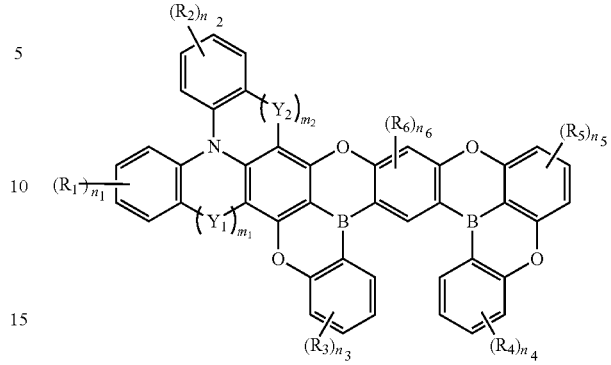

in Formula 4-1 to 4-6, $R_{11}$ to $R_{14}$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring, $n_{11}$ to $n_{14}$ are each independently an integer in a range of 0 to 5, and $Y_1$, $Y_2$, $Ar_1$, $R_1$ to $R_6$, $m_1$, $m_2$, and $n_1$ to $n_6$ are the same as defined in Formula 1 and Formula 2 above.

In an embodiment, the fused polycyclic compound represented by Formula 1 above may be represented by the following Formula 5:

Formula 4-3

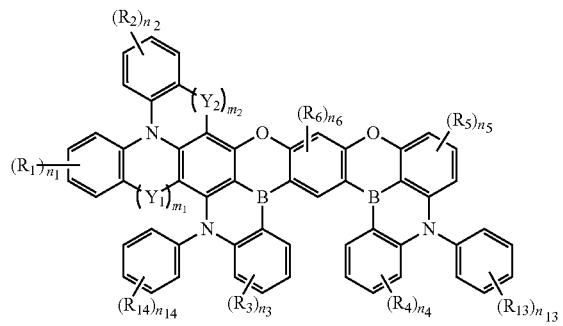

Formula 5

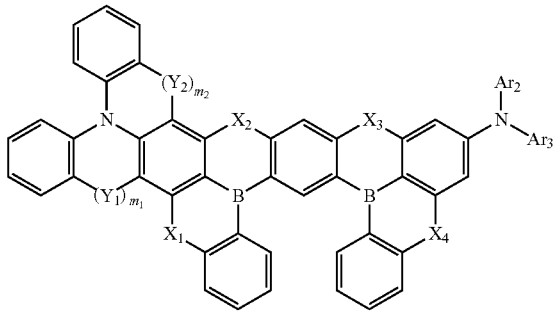

in Formula 5, $Ar_2$ and $Ar_3$ are each independently a substituted or unsubstituted aryl group of 6 to 60 ring-forming carbon atoms, or a substituted or unsubstituted heteroaryl group of 2 to 60 ring-forming carbon atoms, and $X_1$ to $X_4$, $R_a$, $Y_1$, $Y_2$, $Ar_1$, $m_1$ and $m_2$ are the same as defined in Formula 1 and Formula 2 above.

In an embodiment, in Formula 1, when $X_1$ to $X_4$ are each independently $NR_a$, $R_a$ may be a substituted or unsubstituted phenyl group.

In an embodiment, in Formula 1, $Ar_1$ may be a substituted or unsubstituted phenyl group.

In an embodiment, in Formula 1, when $m_1$ is 1, $X_1$ may be O or S, and in case where $m_2$ is 1, $X_2$ may be O or S.

A fused polycyclic compound according to an embodiment of the present disclosure may be represented by Formula 1 above.

Formula 4-4

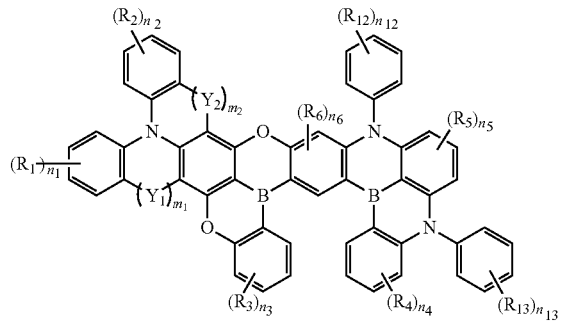

Formula 4-5

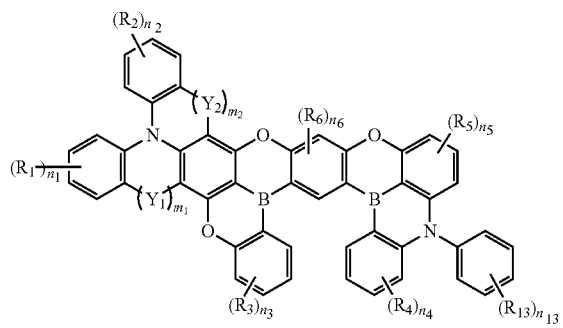

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
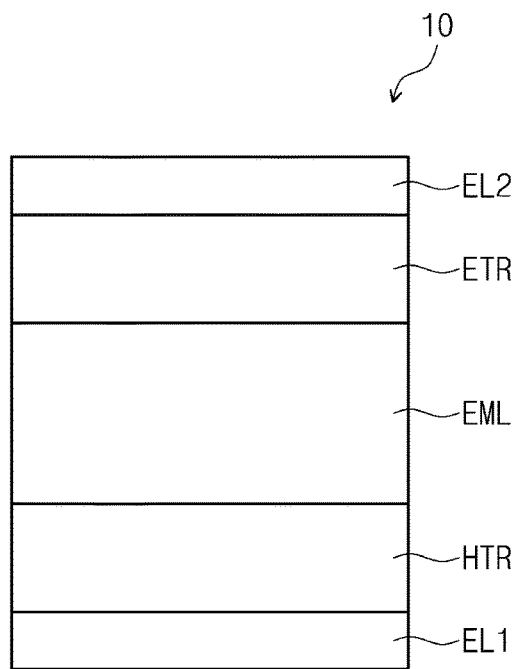
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on," "connected to," or "coupled to" another element, it can be directly on, connected to, or coupled to the other element or a third intervening elements may be present.

Like reference numerals refer to like elements throughout. In addition, in the drawings, the thickness, the ratio, and the dimensions of constituent elements may be exaggerated for clarity of illustration.

The term "and/or" includes one or more combinations which may be defined by the relevant elements.

It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

In addition, the terms "below," "beneath," "on," and "above" are used for explaining the relation of elements shown in the drawings. These terms are relative concepts and are explained based on the directions shown in the drawing, but the present disclosure is not limited thereto.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the present disclosure will be explained with reference to attached drawings.

FIG. 1 to FIG. 4 are cross-sectional views schematically showing organic electroluminescence devices according to exemplary embodiments of the present disclosure. Referring to FIGS. 1 to 4, in an organic electroluminescence device 10 of an embodiment, a first electrode EL1 faces a second electrode EL2, and a plurality of organic layers may be between the first electrode EL1 and the second electrode EL2. The plurality of the organic layers may include a hole transport region HTR, an emission layer EML and an electron transport region ETR. For example, the organic electroluminescence device 10 of an embodiment may include a first electrode EL1, a hole transport region HTR, an emission layer EML, an electron transport region ETR, and a second electrode EL2, stacked one by one. A capping layer CPL may be further included on the second electrode EL2.

The organic electroluminescence device 10 of an embodiment may include a fused polycyclic compound of an embodiment, which will be further explained herein below, in at least one organic layer among the plurality of the organic layers between the first electrode EL1 and the second electrode EL2. For example, the organic electroluminescence device 10 of an embodiment may include a fused polycyclic compound of an embodiment, which will be further explained herein below, in the emission layer EML between the first electrode EL1 and the second electrode EL2. However, embodiments of the present disclosure are not limited thereto, and the organic electroluminescence device 10 of an embodiment may include a fused polycyclic compound of an embodiment, which will be further explained herein below, in at least one organic layer included in the hole transport region HTR and the electron transport region ETR, which are the plurality of the organic layers between the first electrode EL1 and the second electrode EL2 in addition to the emission layer EML, or may include a fused polycyclic compound of an embodiment, which will be further explained herein below, in the capping layer CPL on the second electrode EL2.

Figure 2:
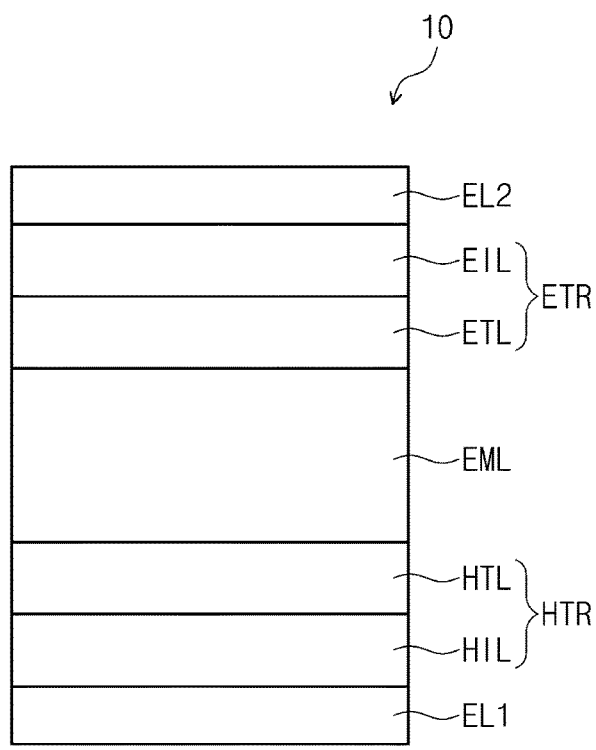
FIG. 2 is a cross-sectional view schematically illustrating an organic electroluminescence device according to an embodiment of the present disclosure.
Figure 3:
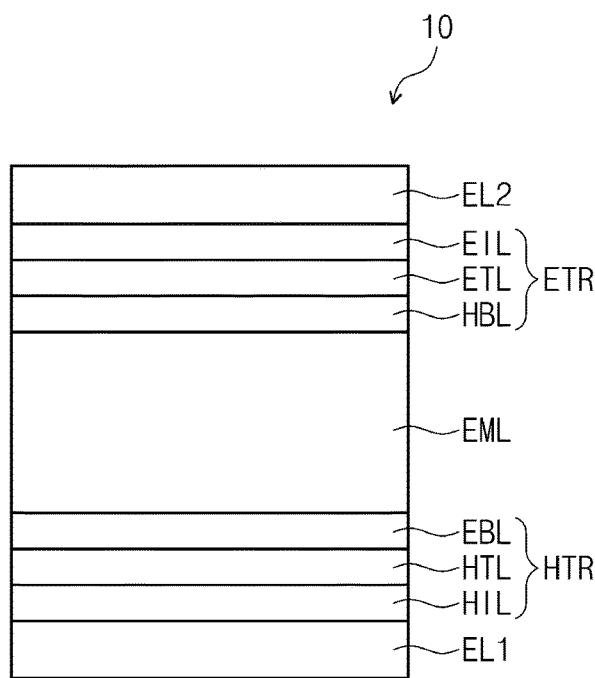
FIG. 3 is a cross-sectional view schematically illustrating an organic electroluminescence device according to an embodiment of the present disclosure.
Figure 4:
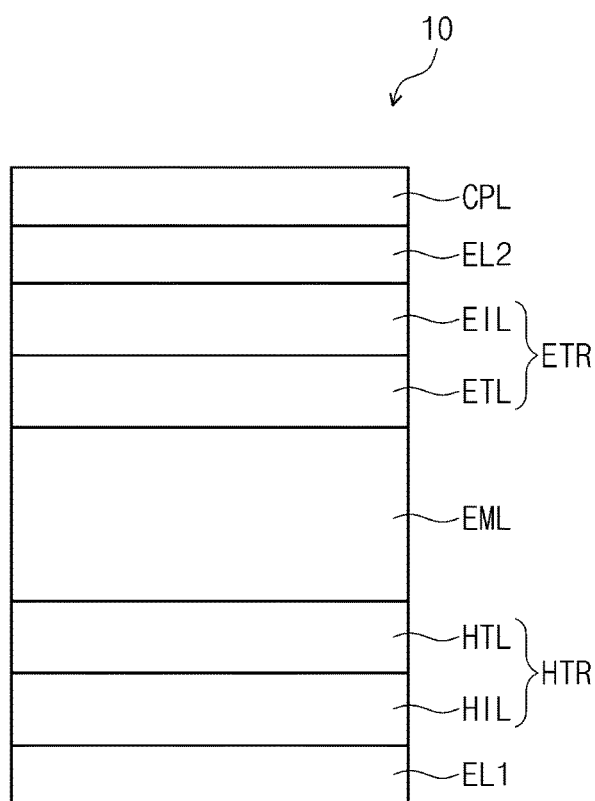
FIG. 4 is a cross-sectional view schematically illustrating an organic electroluminescence device according to an embodiment of the present disclosure.

When compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment including a capping layer CPL on the second electrode EL2.

Hereinafter, in explaining the organic electroluminescence device 10 of an embodiment, the emission layer EML is explained to include a fused polycyclic compound according to an embodiment, which will be further explained herein below, but embodiments of the present disclosure are not limited thereto. The fused polycyclic compound according to an embodiment, which will be further explained herein below, and may be included in the hole transport region HTR, electron transport region ETR, and/or capping layer CPL.

The first electrode EL1 has conductivity (e.g., electrical conductivity). The first electrode EL1 may be formed using a metal alloy and/or a conductive compound (e.g., an electrically conductive compound). The first electrode EL1 may be an anode. The first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transmissive conductive layer formed using ITO, IZO, ZnO, and/or ITZO. For example, the first electrode EL1 may include a three-layer structure of ITO/Ag/ITO. However, embodiments of the present disclosure are not limited thereto. The thickness of the first electrode EL1 may be in a range from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be in a range from about 50 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound such as copper phthalocyanine, N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL includes an amine compound represented by Formula a below:

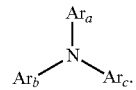

Formula a

In Formula a, $Ar_a$ to $Ar_c$ are each independently a substituted or unsubstituted aryl group of 6 to 60 ring-forming carbon atoms, or a substituted or unsubstituted heteroaryl group of 2 to 60 ring-forming carbon atoms. $Ar_a$ to $Ar_c$ may be, for example, each independently a substituted or unsubstituted phenyl group, a substituted or unsubstituted naphthyl group, a substituted or unsubstituted biphenyl group, a substituted or unsubstituted triphenyl group, a substituted or unsubstituted fluorenyl group, a substituted or unsubstituted carbazole group, or a substituted or unsubstituted dibenzofuranyl group.

If each of $Ar_a$ to $Ar_c$ is substituted, a substituent may be a substituted or unsubstituted amine group, a substituted or unsubstituted oxy group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. Otherwise, if each of $Ar_a$ to $Ar_c$ is substituted, a substituent may be combined with an adjacent group to form a ring. If each of $Ar_a$ to $Ar_c$ is substituted, a substituent may be a substituted or unsubstituted amine group, a substituted or unsubstituted oxy group, a substituted or unsubstituted methyl group, a substituted or unsubstituted phenyl group, a substituted or unsubstituted fluorenyl group, a substituted or unsubstituted carbazole group, or a substituted or unsubstituted di benzofuranyl group.

In an embodiment, each of $Ar_a$ to $Ar_c$ or at least one selected from among substituents substituted at each of $Ar_a$ to $Ar_c$ may be a substituted or unsubstituted fluorenyl group, or a substituted or unsubstituted dibenzoheterole group. Each of $Ar_a$ to $Ar_c$ or at least one selected from among substituents substituted at each of $Ar_a$ to $Ar_c$ may be a substituted or unsubstituted fluorenyl group, a substituted or unsubstituted carbazole group, or a substituted or unsubstituted dibenzofuranyl group.

The amine compound included in the hole transport layer HTL may be any one selected from among the compounds represented in Compound Group a below:
Compound Group a
HT1
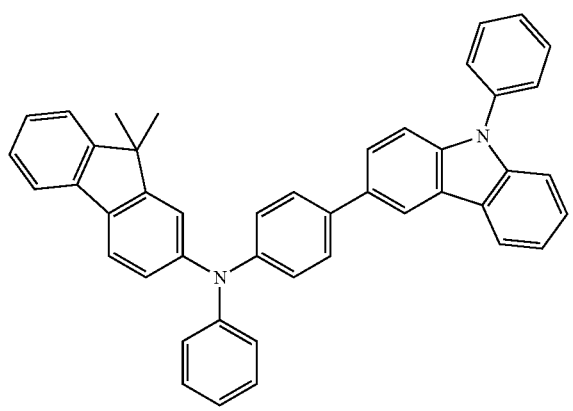
HT2
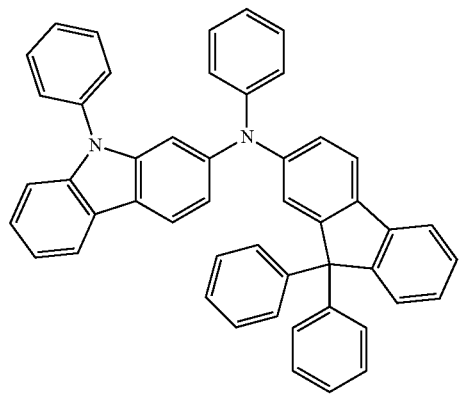
HT3
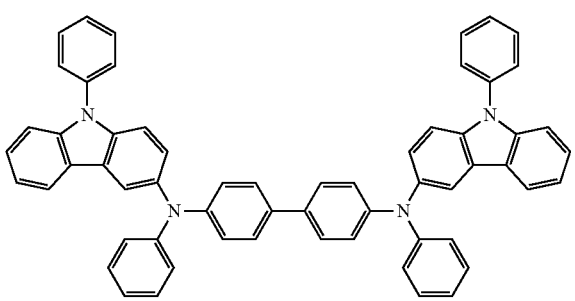
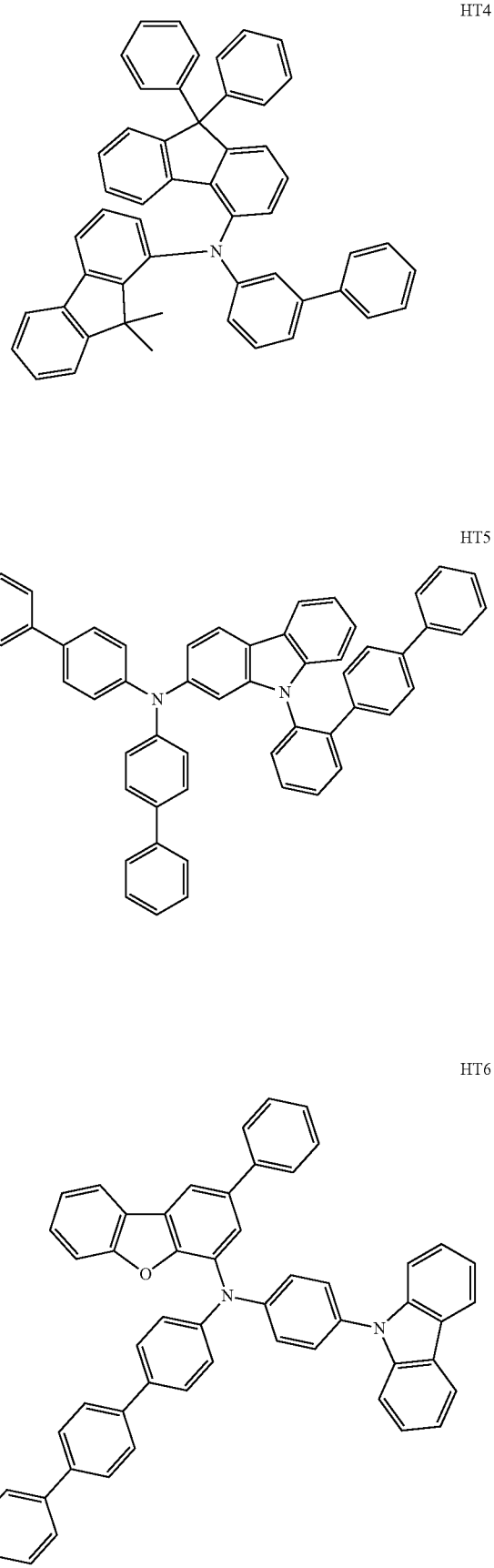

-continued
HT7
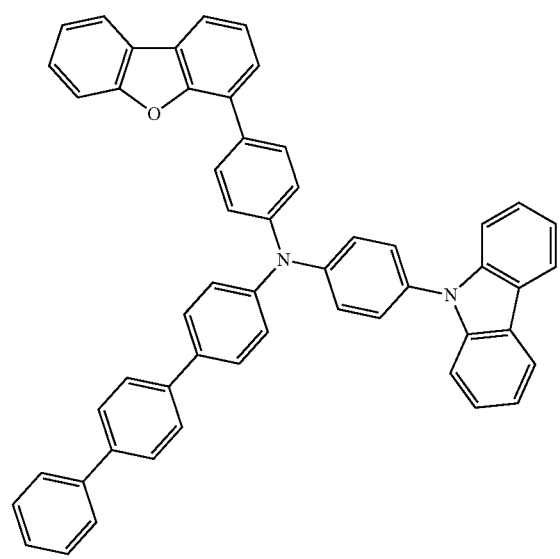
HT8
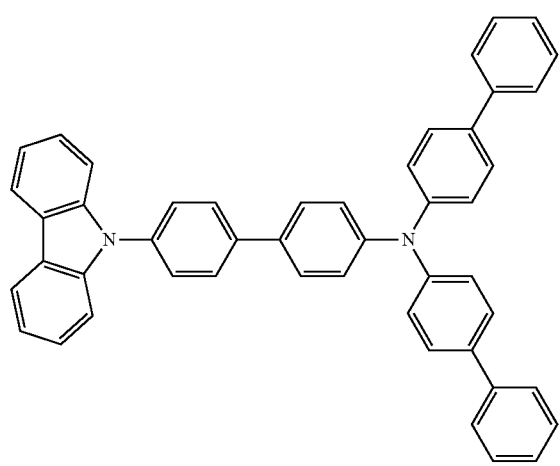
HT9
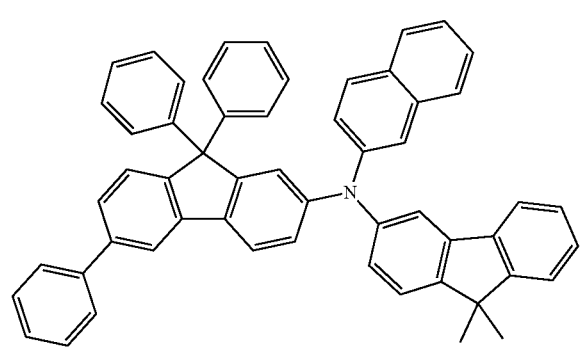
-continued
HT10
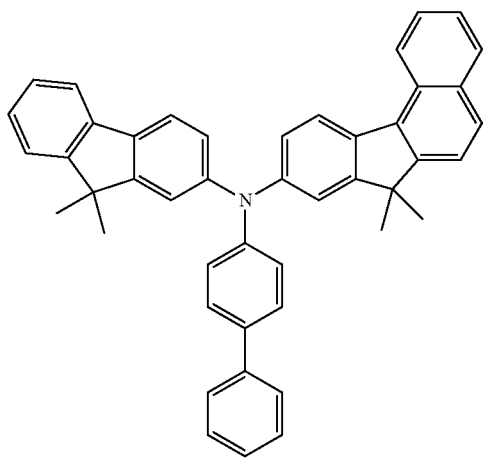
HT11
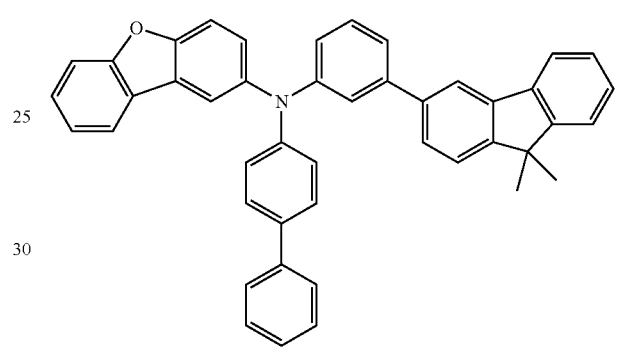
HT12
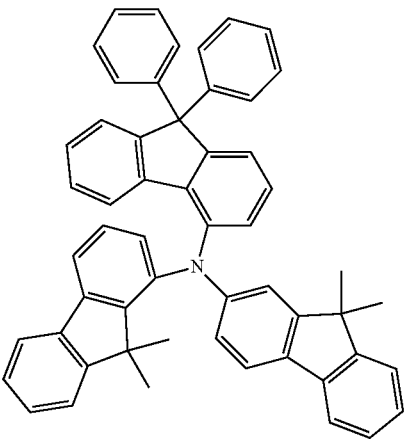
HT13
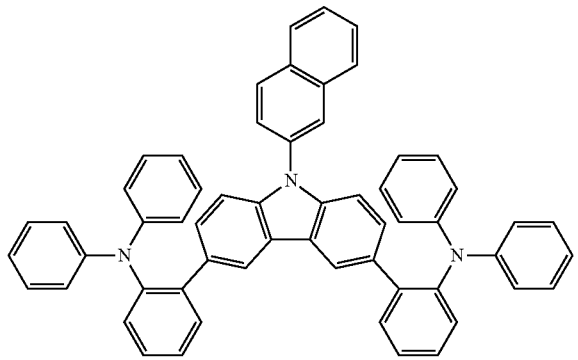

HT14

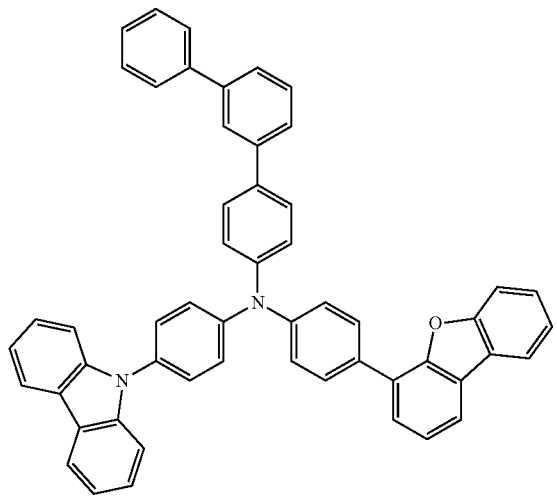

HT15

HT16

HT17

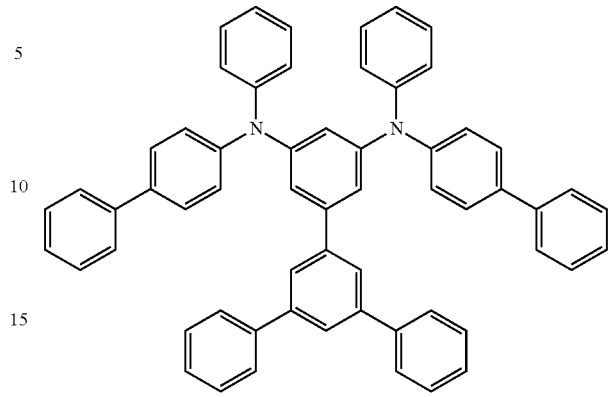

The hole transport layer HTL may further include any suitable compound in addition to the amine compound represented by Formula a above. The hole transport layer HTL may include, for example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be in a range from about 50 Å to about 10,000 Å, for example, from about 100 Å to about 5,000 Å. The thickness of the hole injection layer HIL may be, for example, in a range from about 30 Å to about 1,000 Å, and the thickness of the hole transport layer HTL may be in a range from about 30 Å to about 1,000 Å. For example, the thickness of the electron blocking layer EBL may be in a range from about 10 Å to about 1,000 Å. If the thicknesses of the hole transport region HTR, the hole injection layer HIL, the hole transport layer HTL and the electron blocking layer EBL satisfy any of the above-described ranges, suitable or satisfactory hole transport properties may be achieved without substantial increase of a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may be one of quinone derivatives, metal oxides, and/or cyano group-containing compounds, without limitation. For example, non-limiting examples of the p-dopant may include quinone derivatives such as tetracyanoquinodimethane (TCNQ) and/or 2,3,5,6-tetrafluoro-7,7',8,8'-tetracyanoquinodimethane (F4-TCNQ), metal oxides such as tungsten oxide and/or molybdenum oxide, without limitation.

As described above, the hole transport region HTR may further include at least one of a hole buffer layer or an electron blocking layer EBL in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be used as materials included in a hole buffer layer. The electron blocking layer EBL prevent or reduce the injection of electrons from the electron transport region ETR to the hole transport region HTR.

The emission layer EML is provided on the hole transport region HTR. The emission layer EML may have a thickness in a range of, for example, about 100 Å to about 1,000 Å or about 100 Å to about 300 Å. The emission layer EML may have a single layer formed using a single material, a single layer formed using a plurality of different materials, or a multilayer structure having a plurality of layers formed using a plurality of different materials.

In the organic electroluminescence device 10 of an embodiment, the emission layer EML may include the fused polycyclic compound of an embodiment.

In the present description, the term "substituted or unsubstituted" may mean substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the present description, the term "forming a ring via the combination with an adjacent group" may mean forming a substituted or unsubstituted hydrocarbon ring, or a substituted or unsubstituted heterocycle via combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the present description, the term "adjacent group" may mean a substituent substituted for an atom that is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the present description, a halogen atom may be a fluorine atom, a chlorine atom, a bromine atom, or an iodine atom.

In the present description, an alkyl (e.g., an alkyl group) may be a linear, branched or cyclic type (e.g., a linear alkyl group, a branched alkyl group, or a cyclic alkyl group). The carbon number of the alkyl (or alkyl group) may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, an alkenyl group may be a hydrocarbon group including one or more carbon double bonds at a main chain (e.g., in the middle of) or at a terminal end (e.g., the terminus) of an alkyl group of two or more carbon atoms. The alkenyl group may be a linear chain or a branched chain. The carbon number is not specifically limited, but is in a range of 2 to 30, 2 to 20 or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the present description, an alkynyl group may be a hydrocarbon group including one or more carbon triple bonds at a main chain (e.g., in the middle of) or at a terminal (e.g., a terminus) of an alkyl group of two or more carbon atoms. The alkynyl group may be a linear chain or a branched chain. The carbon number is not specifically limited, but is in a range of 2 to 30, 2 to 20 or 2 to 10. Examples of the alkynyl group include an ethynyl group, a propynyl group, etc., without limitation.

In the present description, a hydrocarbon ring may be an optional functional group or substituent, which is derived from an aliphatic hydrocarbon ring, or an optional functional group or substituent derived from an aromatic hydrocarbon ring. The ring-forming carbon number of the hydrocarbon ring may be in a range of 5 to 60, 5 to 30, or 5 to 20.

In the present description, an aryl group may be an optional functional group or substituent derived from an aromatic hydrocarbon ring. The aryl group may be a monocyclic aryl group or a polycyclic aryl group. The carbon number for forming a ring in the aryl group may be in a range of 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present description, a fluorenyl group may be substituted, and two substituents may be combined with each other to form a spiro structure. Examples of cases where the fluorenyl group is substituted are as follows. However, embodiments of the present disclosure are not limited thereto.

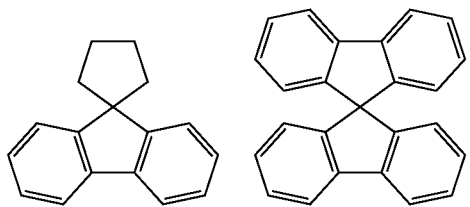

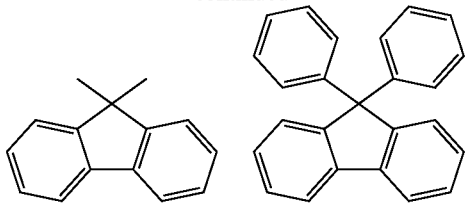

In the present description, a heterocyclic group may be an optional functional group or substituent derived from a ring including one or more selected from among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocycle and aromatic heterocycle may be a monocycle or a polycycle.

In the present description, the heterocyclic group may include one or more among B, O, N, P, Si and S as heteroatoms. If the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The ring-forming carbon number of the heterocyclic group may be in a range of 2 to 30, 2 to 20, or 2 to 10.

In the present description, an aliphatic heterocyclic group may include one or more selected from among B, O, N, P, Si and S as heteroatoms. The ring-forming carbon number of the aliphatic heterocyclic group may be in a range of 2 to 60, 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyrane group, a 1,4-dioxane group, etc., without limitation.

In the present description, a heteroaryl group may include one or more selected from among B, O, N, P, Si and S as heteroatoms. If the heteroaryl group includes two or more heteroatoms, the two or more heteroatoms may be the same or different. The heteroaryl group may be a monocyclic heteroaryl group or polycyclic heteroaryl group. The ring-forming carbon number of the heteroaryl group may be in a range of 2 to 60, 2 to 30, 2 to 20, or 2 to 10. Examples of the heteroaryl group may include thiophene, furan, pyrrole, imidazole, triazole, pyridine, bipyridine, pyrimidine, pyrazine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the present description, the explanation on the aforementioned aryl group may be applied to an arylene group except that the arylene group is a divalent group. The explanation on the aforementioned heteroaryl group may be applied to a heteroarylene group except that the heteroarylene group is a divalent group.

In the present description, a silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the present description, a boryl group includes an alkyl boryl group and an aryl boryl group. Examples of the boryl group include a trimethylboryl group, a triethylboryl group, a t-butyldimethylboryl group, a triphenylboryl group, a diphenylboryl group, a phenylboryl group, etc., without limitation.

In the present description, the carbon number of the amine group is not specifically limited, but may be in a range of 1 to 30. The amine group may include an alkyl amine group, an aryl amine group, or a heteroaryl amine group. Examples of the amine group include a methylamine group, a dimethylamine group, a phenylamine group, a naphthylamine group, a 9-methyl-anthracenylamine group, a triphenylamine group, etc., without limitation.

In the present description, an oxy group may include an alkoxy group and an aryl oxy group. The alkoxy group may be a linear chain, a branched chain, or a ring or rings. The carbon number of the alkoxy group is not specifically limited but may be in a range of, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., without limitation.

In the present description, the alkyl group in an alkyl thio group, an alkyl sulfoxy group, an alkyl aryl group, an alkyl amine group, an alkyl boryl group, and an alkyl silyl group may be the same as the examples of the aforementioned alkyl group.

In the present description, the aryl group in an aryl oxy group, an aryl thio group, an aryl sulfoxy group, an aryl amine group, an aryl boryl group, and an aryl silyl group may be the same as the examples of the aforementioned aryl group.

In the present description, a direct linkage may be a single bond (e.g., a single, covalent chemical bond).

The fused polycyclic compound of an embodiment includes three or four boron atoms and may include a fused structure of seven aromatic rings having three or four boron atoms therebetween. In the fused polycyclic compound of an embodiment, based on a structure in which three aromatic rings are connected to each of two boron atoms, and two boron atoms are connected with one aromatic ring, that is, a fused structure of two boron atoms and five aromatic rings, two aromatic rings may be further fused through one nitrogen atom and one or two boron atoms. The fused polycyclic compound of an embodiment may include a structure in which seven aromatic rings are connected through three or four boron atoms and five heteroatoms, and at least one of the heteroatoms may be a nitrogen atom.

The fused polycyclic compound of an embodiment may be represented by Formula 1 below.

Formula 1

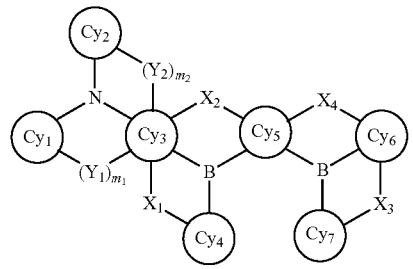

In Formula 1, $Cy_1$ to $Cy_7$ are each independently a substituted or unsubstituted aromatic hydrocarbon ring, or a substituted or unsubstituted aromatic heterocycle. $Cy_1$ to $Cy_7$ may be each independently a substituted or unsubstituted five-member or six-member aromatic hydrocarbon ring, or a substituted or unsubstituted five-member or six-member aromatic heterocycle. In an embodiment, $Cy_1$ to $Cy_7$ may be each independently a substituted or unsubstituted benzene ring.

In Formula 1, $X_1$ to $X_4$ may be each independently $NR_a$, O or S. $X_1$ to $X_4$ may be the same or different from each other. In an embodiment, $X_1$ to $X_4$ all may be O or S, or $NR_a$. In some embodiments, one selected from among $X_1$ to $X_4$ may be $NR_a$, and remaining three may be O or S. In some embodiments, two selected from among $X_1$ to $X_4$ may be $NR_a$, and remaining two may be O or S. In some embodiments, three selected from among $X_1$ to $X_4$ may be $NR_a$, and remaining one may be O or S.

In Formula 1, $R_a$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms. $R_a$ may be a substituted or unsubstituted aryl group of 6 to 30 ring-forming carbon atoms, or a substituted or unsubstituted heteroaryl group of 2 to 30 ring-forming carbon atoms. In an embodiment, $R_a$ may be a substituted or unsubstituted phenyl group. In an embodiment, $R_a$ may be an unsubstituted phenyl group, or a phenyl group substituted with a methyl group.

In Formula 1, $Y_1$ and $Y_2$ may be each independently $BAr_1$. $Ar_1$ may be a substituted or unsubstituted aryl group of 6 to 60 ring-forming carbon atoms, or a substituted or unsubstituted heteroaryl group of 2 to 60 ring-forming carbon atoms. In an embodiment, $Ar_1$ may be a substituted or unsubstituted phenyl group. In an embodiment, $Ar_1$ may be an unsubstituted phenyl group or a phenyl group substituted with a methyl group.

In Formula 1, $m_1$ and $m_2$ are each independently 0 or 1. A case where $m_1$ is 0 may mean that $Cy_1$ and $Cy_3$ are not connected via $Y_1$, and a case where $m_1$ is 1 may mean that $Cy_1$ and $Cy_3$ are connected via $Y_1$. A case where $m_2$ is 0 may mean that $Cy_2$ and $Cy_3$ are not connected via $Y_2$, and a case where $m_2$ is 1 may mean that $Cy_2$ and $Cy_3$ are connected via $Y_2$. At least one selected from among $m_1$ and $m_2$ may be 1. In an embodiment, $m_1$ may be 1, and $m_2$ may be 0, or $m_2$ may be 1, and $m_1$ may be 0, or both $m_1$ and $m_2$ may be 1. For example, a case where both $m_1$ and $m_2$ are 0 in Formula 1 is excluded, a boryl group connecting $Cy_1$ and $Cy_3$, and/or $Cy_2$ and $Cy_3$ may be exist.

The fused polycyclic compound of an embodiment, when compared with an existing polycyclic compound including a nitrogen atom and a boron atom in a core, includes three or four boron atoms and has a structure in which seven aromatic rings are connected through three or four boron atoms and five heteroatoms, thereby having a multiple resonance structure having a wide plate-type skeleton (e.g., the core of the fused polycyclic compound has a wide plate-like structure that lies in the same or substantially the same plane). Accordingly, the fused polycyclic compound of an embodiment includes three or four boron atoms and shows a wide plate-type skeleton and multiple resonances, and accordingly, HOMO and LUMO states in one molecule may be easily separated, and the fused polycyclic compound may be used as a material for emitting delayed fluorescence. The fused polycyclic compound of an embodiment may have a reduced difference ($\Delta E_{ST}$) between the lowest triplet excitation energy level (T1 level) and the lowest singlet excitation energy level (S1 level) due to the structure, and accordingly, if used as a material for emitting delayed fluorescence, the emission efficiency of an organic electroluminescence device may be even further improved.

The fused polycyclic compound represented by Formula 1 may be represented by Formula 2 below.

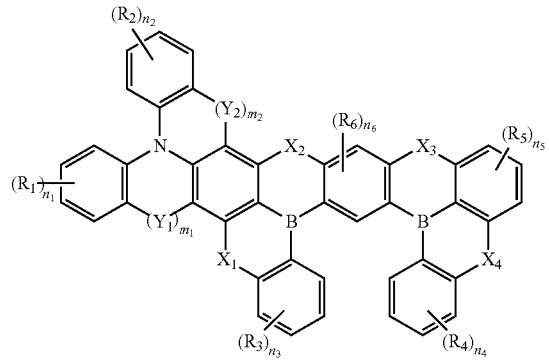

Formula 2

Formula 2 represent Formula 1 where $Cy_1$ to $Cy_7$ are specified as substituted or unsubstituted benzene rings.

In Formula 2, $R_1$ to $R_6$ may be each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. $R_1$ to $R_7$ may be each independently a hydrogen atom, a deuterium atom, a halogen atom, a substituted or unsubstituted aryl amine group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. In an embodiment, $R_1$ to $R_7$ may be each independently a hydrogen atom, a substituted or unsubstituted diphenylamine group, or a substituted or unsubstituted carbazole group.

In Formula 2, $n_1$ to $n_4$ are each independently an integer in a range of 0 to 4. In a case where $n_1$ is 0, the fused polycyclic compound according to an embodiment may not be substituted with $R_1$. A case where $n_1$ is 4, and all $R_1$ groups are hydrogen atoms, may be the same as the case where $n_1$ is 0. In a case where $n_1$ is an integer of 2 or more, a plurality of all $R_1$ groups may be the same, or at least one of the plurality of $R_1$ groups may be different. In a case where $n_2$ is 0, the fused polycyclic compound according to an embodiment may not be substituted with $R_2$. A case where $n_2$ is 4, and all $R_2$ groups are hydrogen atoms, may be the same as the case where $n_2$ is 0. In a case where $n_2$ is an integer of 2 or more, a plurality of all $R_2$ groups may be the same, or at least one of the plurality of $R_2$ groups may be different. In a case where $n_3$ is 0, the fused polycyclic compound according to an embodiment may not be substituted with $R_3$. A case where $n_3$ is 4, and all $R_3$ groups are hydrogen atoms, may be the same as the case where $n_3$ is 0. In a case where $n_3$ is an integer of 2 or more, a plurality of all $R_3$ groups may be the same, or at least one of the plurality of $R_3$ groups may be different. In a case where $n_4$ is 0, the fused polycyclic compound according to an embodiment may not be substituted with $R_4$. A case where $n_4$ is 4, and all $R_4$ groups are hydrogen atoms, may be the same as the case where $n_4$ is 0. In a case where $n_4$ is an integer of 2 or more, a plurality of all $R_4$ groups may be the same, or at least one of the plurality of $R_4$ groups may be different.

In Formula 2, $n_5$ is an integer in a range of 0 to 3. In a case where $n_5$ is 0, the fused polycyclic compound according to an embodiment may not be substituted with $R_5$. A case where $n_5$ is 3, and all $R_5$ groups are hydrogen atoms, may be the same as the case where $n_5$ is 0. In a case where $n_5$ is an integer of 2 or more, a plurality of all $R_5$ groups may be the same, or at least one of the plurality of $R_5$ groups may be different.

In Formula 2, $n_6$ is an integer in a range of 0 to 2. In a case where $n_6$ is 0, the fused polycyclic compound according to an embodiment may not be substituted with $R_6$. A case where $n_6$ is 2, and all $R_6$ groups are hydrogen atoms, may be the same as the case where $n_6$ is 0. In a case where $n_6$ is 2, a plurality of all $R_6$ groups may be the same, or at least one of the plurality of $R_6$ groups may be different.

In Formula 2, the same explanation of $X_1$ to $X_4$, $Y_1$, $Y_2$, $R_a$, $Ar_1$, $m_1$ and $m_2$ referring to Formula 1 above may be applied.

The fused polycyclic compound represented by Formula 1 may be represented by 3-a to Formula 3-c below.

Formula 3-a

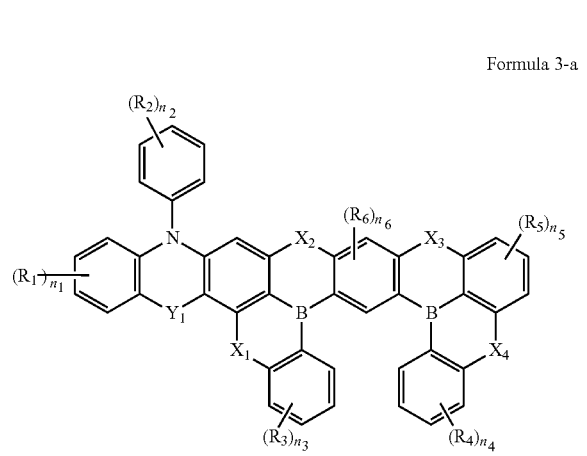

Formula 3-b

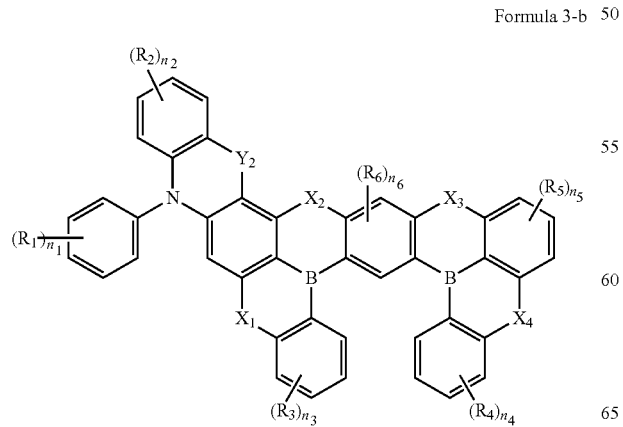

Formula 3-c

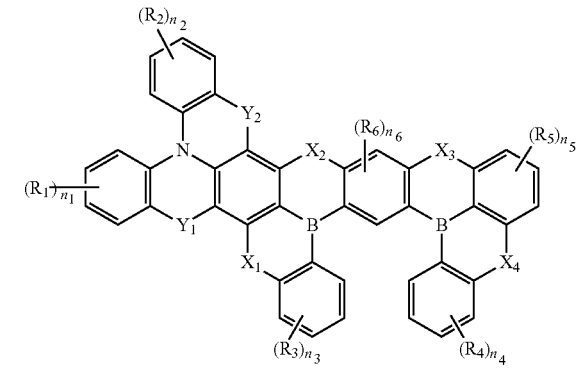

Formula 3-a to 3-c correspond to Formula 2, wherein $m_1$ and $m_2$ are specified as 0 or 1.

In Formula 3-a to Formula 3-c, the same explanation of $X_1$ to $X_4$, $R_a$, $Y_1$, $Y_2$, $R_1$ to $R_6$, and $n_1$ to $n_6$ referring to Formula 1 and Formula 2 above may be applied.

The fused polycyclic compound represented by Formula 1 may be represented by Formula 3-1 to Formula 3-3 below.

Formula 3-1

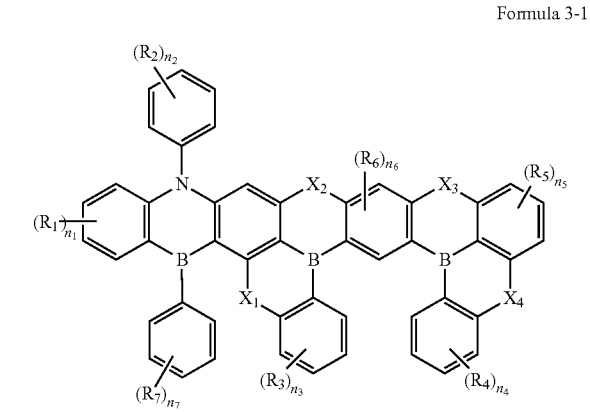

Formula 3-2

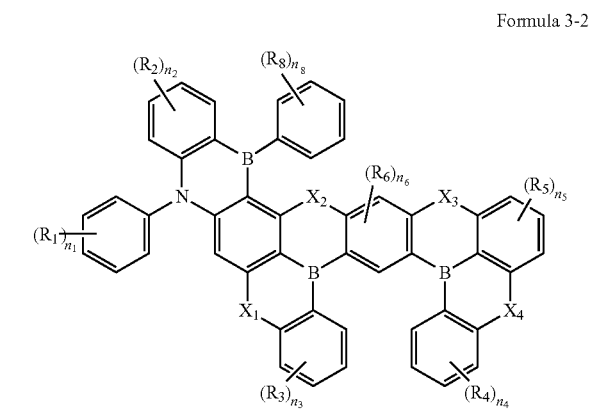

-continued

Formula 3-3

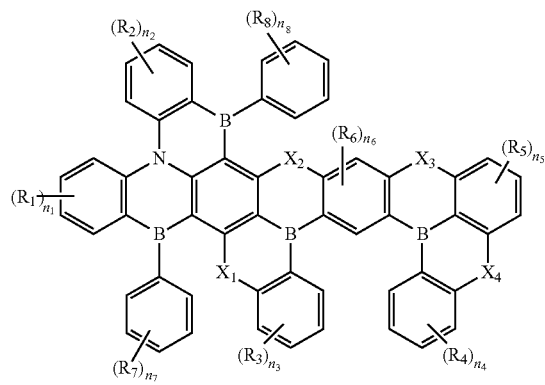

Formula 3-1 to Formula 3-3 correspond to Formula 2, wherein $Ar_1$ is specified as a substituted or unsubstituted phenyl group, and $m_1$ and $m_2$ are specified as 0 or 1.

In Formula 3-1 to Formula 3-3, $R_7$ and $R_8$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring. $R_7$ and $R_8$ may be each independently a hydrogen atom, a deuterium atom, a halogen atom, a substituted or unsubstituted aryl amine group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. In an embodiment, $R_7$ and $R_8$ may be each independently a hydrogen atom, a substituted or unsubstituted diphenylamine group, or a substituted or unsubstituted carbazole group.

In Formula 3-1 to Formula 3-3, $n_7$ and $n_8$ are each independently an integer in a range of 0 to 5. In a case where $n_7$ is 0, the fused polycyclic compound according to an embodiment may not be substituted with $R_7$. A case where $n_7$ is 5, and all $R_7$ groups are hydrogen atoms, may be the same as the case where $n_7$ is 0. In a case where $n_7$ is an integer of 2 or more, a plurality of all $R_7$ groups may be the same, or at least one of the plurality of $R_7$ groups may be different. In a case where $n_8$ is 0, the fused polycyclic compound according to an embodiment may not be substituted with $R_8$. A case where $n_8$ is 5, and all $R_8$ groups are hydrogen atoms, may be the same as the case where $n_8$ is 0. In a case where $n_8$ is an integer of 2 or more, a plurality of $R_8$ groups may be the same, or at least one of the plurality of $R_8$ groups may be different.

In Formula 3-1 to Formula 3-3, the same explanation of $X_1$ to $X_4$, $R_a$, $R_1$ to $R_6$, and $n_1$ to $n_6$ referring to Formula 1 and Formula 2 above may be applied.

The fused polycyclic compound represented by Formula 1 may be represented by Formula 4-1 to Formula 4-6 below.

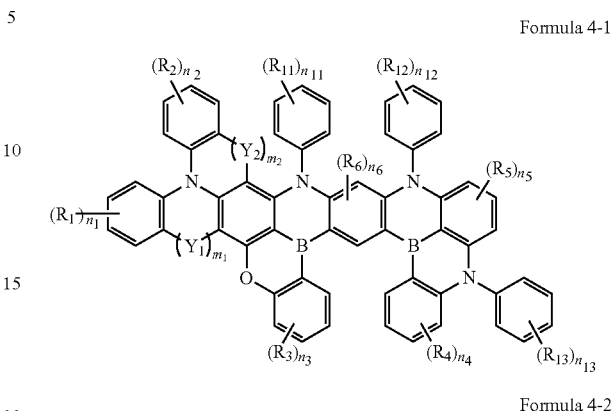

Formula 4-5

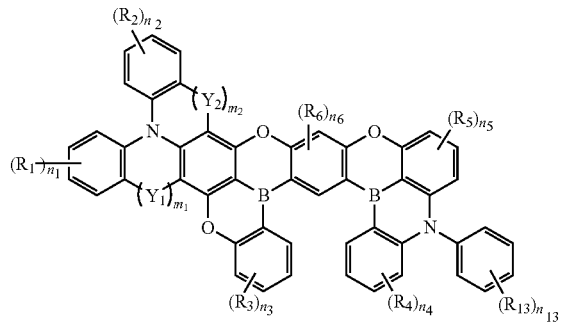

Formula 4-6

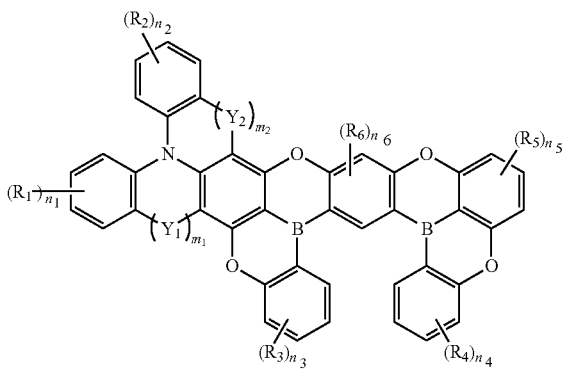

Formula 4-1 to Formula 4-6 correspond to Formula 2, wherein $X_1$ to $X_4$ are specified as $NR_a$, O, or S.

In Formula 4-1 to Formula 4-6, $R_{11}$ to $R_{14}$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring. $R_{11}$ to $R_{14}$ may be each independently a hydrogen atom, a deuterium atom, a halogen atom, a substituted or unsubstituted aryl amine group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms. In an embodiment, $R_{11}$ to $R_{14}$ may be each independently a hydrogen atom, a substituted or unsubstituted diphenylamine group, or a substituted or unsubstituted carbazole group.

In Formula 4-1 to Formula 4-6, $n_{11}$ to $n_{14}$ are each independently an integer in a range of 0 to 5. In a case where $n_{11}$ is 0, the fused polycyclic compound according to an embodiment may not be substituted with $R_{11}$. A case where $n_{11}$ is 5, and all $R_{11}$ groups are hydrogen atoms, may be the same as the case where $n_{11}$ is 0. In a case where $n_{11}$ is an integer of 2 or more, a plurality of all $R_{11}$ groups may be the same, or at least one of the plurality of $R_{11}$ groups may be different. In a case where $n_{12}$ is 0, the fused polycyclic compound according to an embodiment may not be substituted with $R_{12}$. A case where $n_{12}$ is 5, and all $R_{12}$ groups are hydrogen atoms, may be the same as the case where $n_{12}$ is 0. In a case where $n_{12}$ is an integer of 2 or more, a plurality of all $R_{12}$ groups may be the same, or at least one of the plurality of $R_{12}$ groups may be different. In a case where $n_{13}$ is 0, the fused polycyclic compound according to an embodiment may not be substituted with $R_{13}$. A case where $n_{13}$ is 5, and all $R_{13}$ groups are hydrogen atoms, may be the same as the case where $n_{13}$ is 0. In a case where $n_{13}$ is an integer of 2 or more, a plurality of $R_{13}$ groups may be the same, or at least one of the plurality of $R_{13}$ groups may be different. In a case where $n_{14}$ is 0, the fused polycyclic compound according to an embodiment may not be substituted with $R_{14}$. A case where $n_{14}$ is 5, and all $R_{14}$ groups are hydrogen atoms, may be the same as the case where $n_{14}$ is 0. In a case where $n_{14}$ is an integer of 2 or more, a plurality of $R_{14}$ groups may be the same, or at least one of the plurality of $R_{14}$ groups may be different.

In Formula 4-1 to Formula 4-6, the same explanation of $Y_1$, $Y_2$, $Ar_1$, $R_1$ to $R_6$, $m_1$, $m_2$, and $n_1$ to $n_6$ referring to Formula 1 and Formula 2 above may be applied.

The fused polycyclic compound represented by Formula 1 may be represented by Formula 5 below.

Formula 5

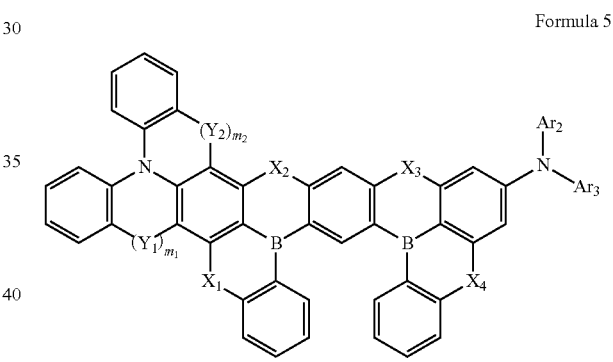

Formula 5 corresponds to Formula 2, wherein $n_1$ to $n_4$, and $n_6$ are 0, $n_6$ is 1, the substitution position of $R_5$ is specified, and $R_5$ is specified as a substituted amine group.

In Formula 5, $Ar_2$ and $Ar_3$ may be each independently a substituted or unsubstituted aryl group of 6 to 60 ring-forming carbon atoms, or a substituted or unsubstituted heteroaryl group of 2 to 60 ring-forming carbon atoms. In an embodiment, $Ar_2$ and $Ar_3$ may be substituted or unsubstituted phenyl groups.

In Formula 5, the same explanation of $X_1$ to $X_4$, $R_a$, $Y_1$, $Y_2$, $Ar_1$, $m_1$ and $m_2$ referring to Formula 1 and Formula 2 above may be applied.

The fused polycyclic compound of an embodiment may be any one selected from among the compounds represented in Compound Group 1 below. The organic electroluminescence device 10 of an embodiment may include at least one fused polycyclic compound selected from among the compounds represented in Compound Group 1 in an emission layer EML.

Compound Group 1
1
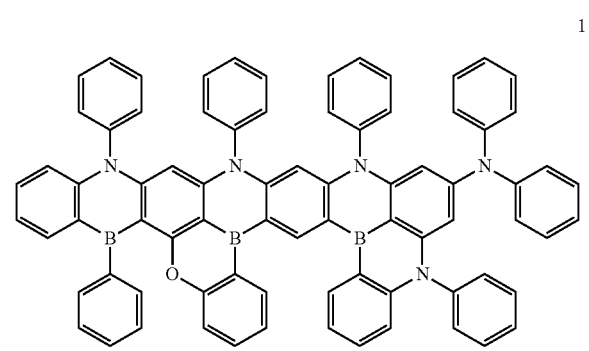
2
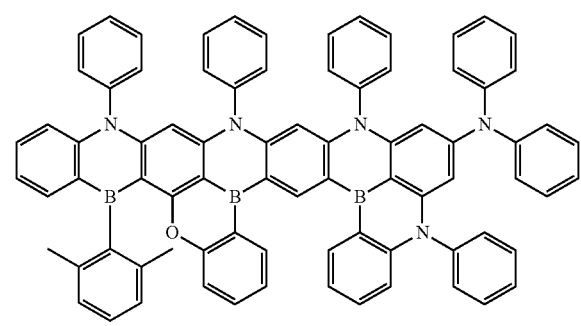
3
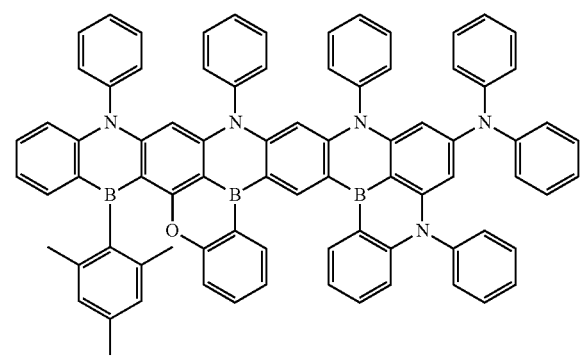
4
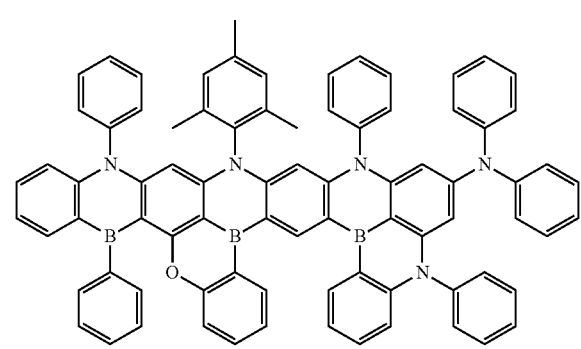
5
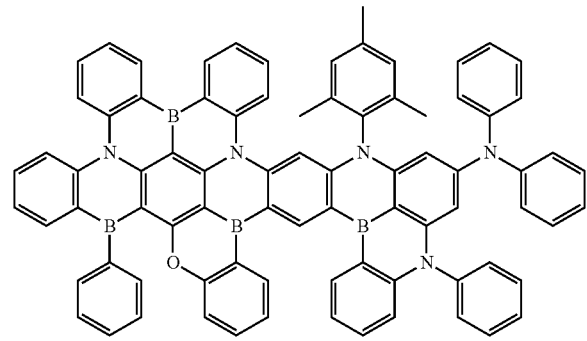
6
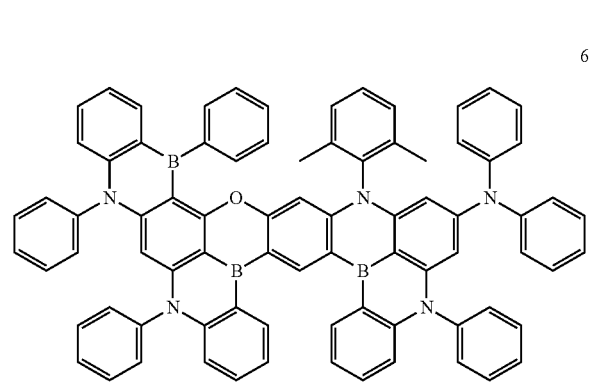
7
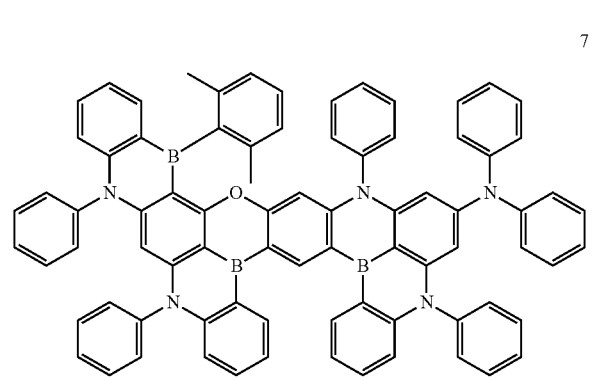
8
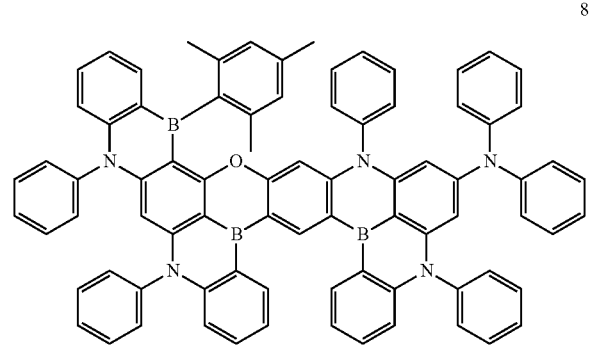

9
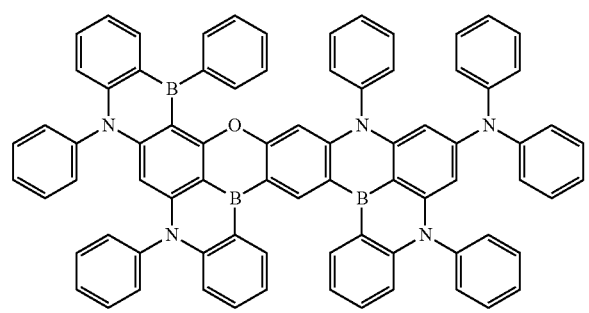
10
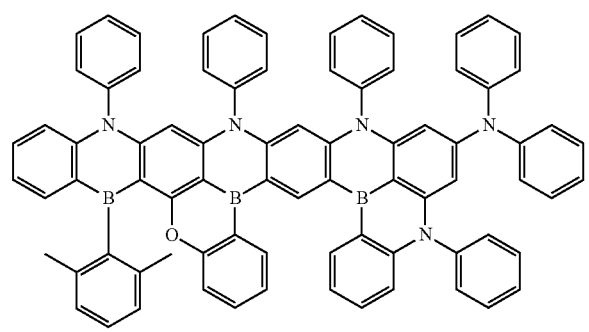
11
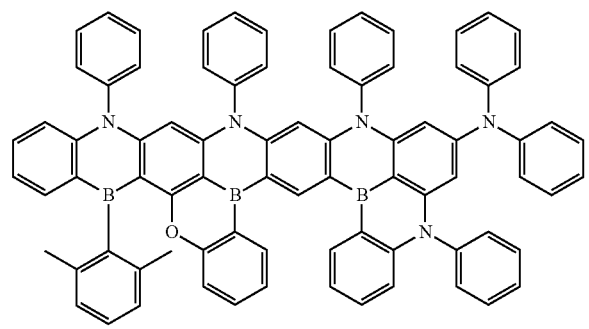
12
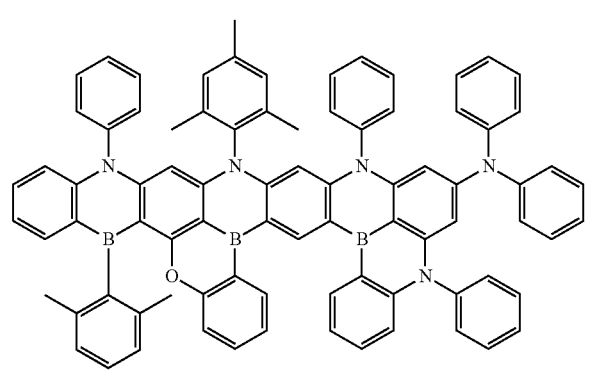
13
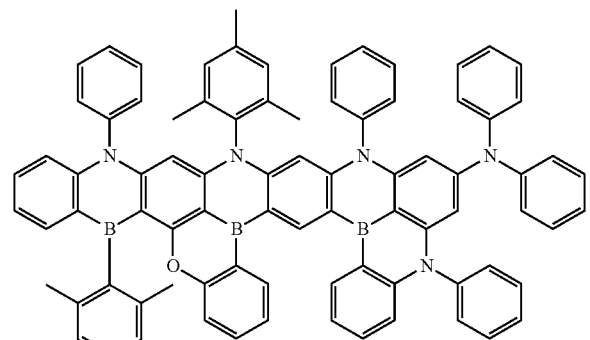
14
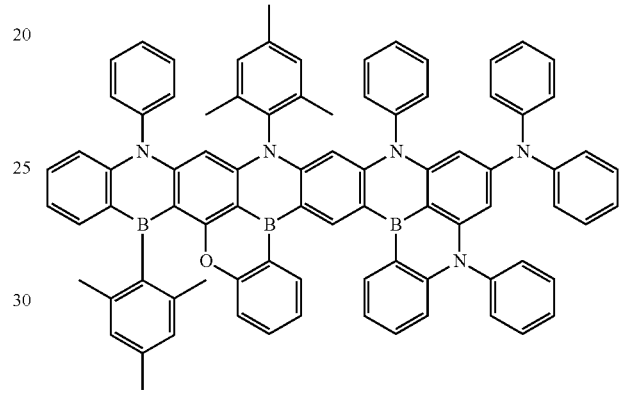
15
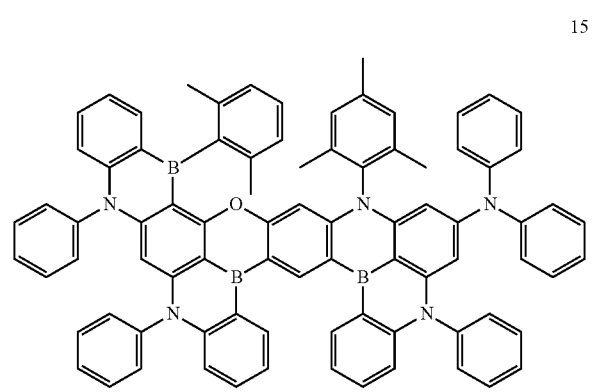
16
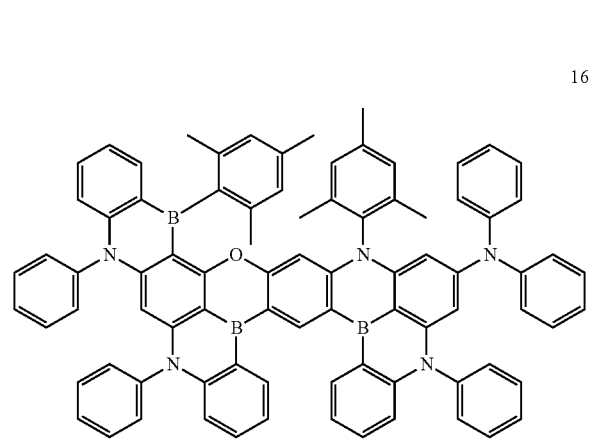

17
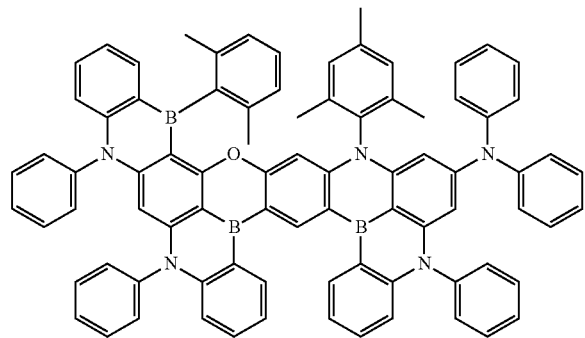
18
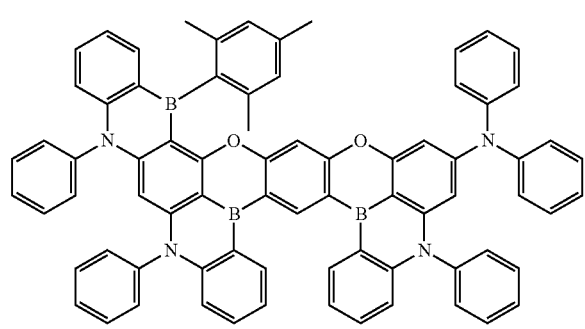
19
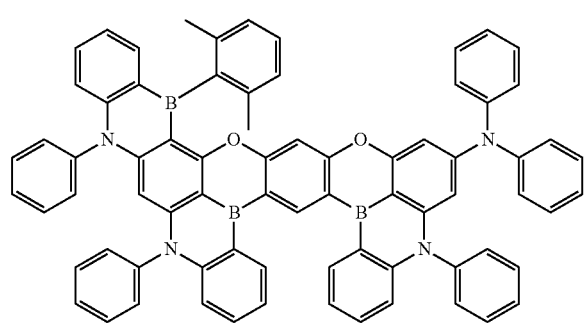
20
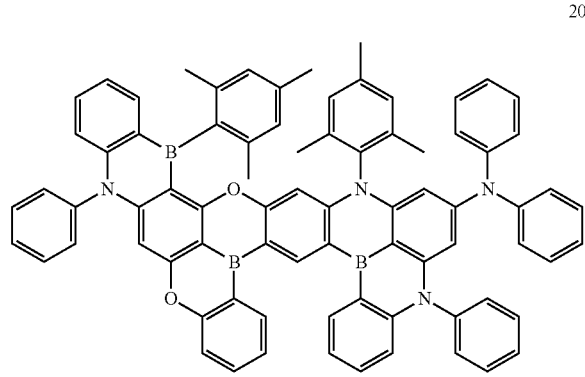
21
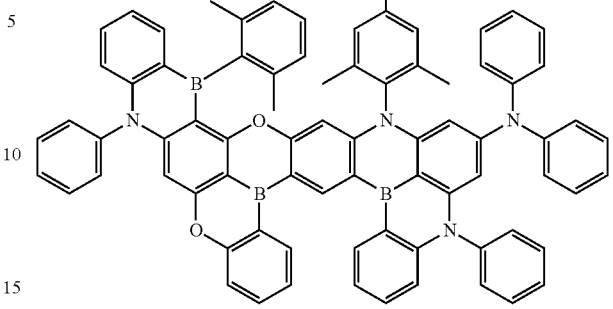
22
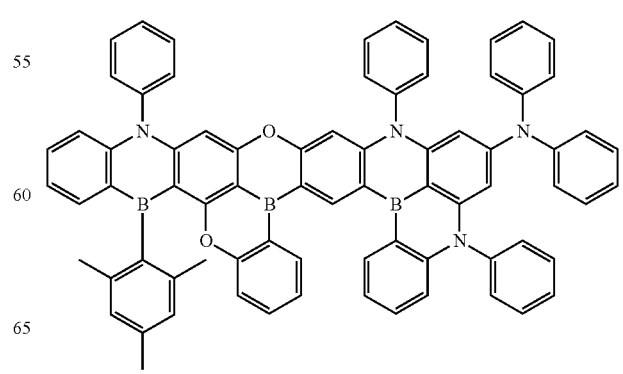
23
24

-continued

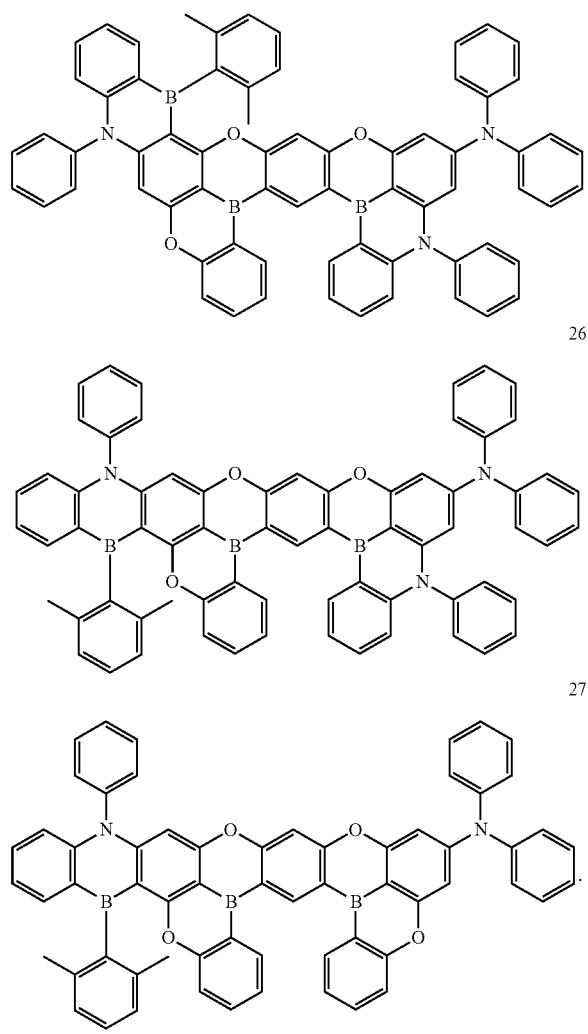

The fused polycyclic compound of an embodiment, represented by Formula 1 may be a material for emitting thermally activated delayed fluorescence. In addition, the fused polycyclic compound of an embodiment, represented by Formula 1 may be a thermally activated delayed fluorescence dopant having a difference ($\Delta E_{ST}$) between the lowest triplet excitation energy level (T1 level) and the lowest singlet excitation energy level (S1 level) of about 0.35 eV or less.

The fused polycyclic compound of an embodiment, represented by Formula 1 may be a light-emitting material having a light-emitting central wavelength in a wavelength region in a range of about 430 nm to about 490 nm. For example, the fused polycyclic compound of an embodiment, represented by Formula 1 may be a blue thermally activated delayed fluorescence (TADF) dopant. However, embodiments of the present disclosure are not limited thereto, and in a case of using the fused polycyclic compound of an embodiment as the light-emitting material, the fused polycyclic compound may be used as a dopant material emitting light in various suitable wavelength regions, such as a red emitting dopant and a green emitting dopant. In some embodiments, the fused polycyclic compound of an embodiment, represented by Formula 1 may be a host.

In the organic electroluminescence device 10 of an embodiment, the emission layer EML may emit delayed fluorescence. For example, the emission layer EML may emit thermally activated delayed fluorescence (TADF).

In the organic electroluminescence device 10 of an embodiment, the emission layer EML may include two or more kinds of the fused polycyclic compound of an embodiment, represented by Formula 1. In an embodiment, the emission layer EML may include a first fused polycyclic compound represented by Formula 1 and a second fused polycyclic compound which is represented by Formula 1 but different from the first fused polycyclic compound. In the emission layer EML, the first fused polycyclic compound may be a host, and the second fused polycyclic compound may be a dopant.

In addition, the emission layer EML of the organic electroluminescence device 10 may emit blue light. For example, the emission layer EML of the organic electroluminescence device 10 of an embodiment may emit blue light in a region of about 490 nm or less. However, embodiments of the present disclosure are not limited thereto, and the emission layer EML may emit green light or red light.

In some embodiments, the organic electroluminescence device 10 of an embodiment may include a plurality of emission layers. The plurality of emission layers may be stacked one by one. For example, the organic electroluminescence device 10 including a plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the fused polycyclic compound of an embodiment.

In an embodiment, the emission layer EML includes a host and a dopant, and may include the fused polycyclic compound of an embodiment as a host and/or dopant. For example, in the organic electroluminescence device 10 of an embodiment, the emission layer EML may include a host for emitting delayed fluorescence and a dopant for emitting delayed fluorescence, and may include the fused polycyclic compound as a dopant for emitting delayed fluorescence. The emission layer EML may include at least one selected from among the fused polycyclic compounds represented in Compound Group 1 as a thermally activated delayed fluorescence dopant. In some embodiments, the emission layer EML may include at least one selected from among the fused polycyclic compounds represented in Compound Group 1 as a host and another one selected from among the fused polycyclic compounds represented in Compound Group 1 as a thermally activated delayed fluorescence dopant. In an embodiment, the emission layer EML may be a delayed fluorescence emission layer.

In an embodiment, the emission layer EML may include any suitable host material in addition to the polycyclic compound represented by Formula 1. As the host material of the emission layer EML, any suitable materials may be used and may be selected from fluoranthene derivatives, pyrene derivatives, arylacetylene derivatives, anthracene derivatives, fluorene derivatives, perylene derivatives, chrysene derivatives, and/or the like, without specific limitation. In some embodiments, pyrene derivatives, perylene derivatives, and/or anthracene derivatives may be used. For example, as the host material of the emission layer EML, anthracene derivatives represented by Formula 6 below may be used.

Formula 6

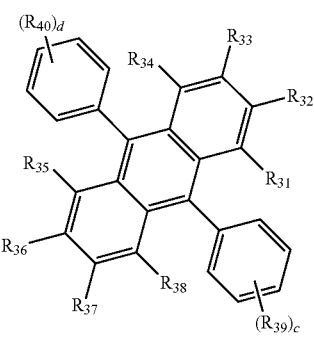

In Formula 6, $R_{31}$ to $R_{40}$ may be each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In addition, $R_{31}$ to $R_{40}$ may be combined with an adjacent group to form a saturated hydrocarbon ring or unsaturated hydrocarbon ring.

In Formula 6, "c" and "d" may be each independently an integer in a range of 0 to 5.

The compound represented by Formula 6 may be any one represented by Compound 6-1 to Compound 6-16 below.

6-1

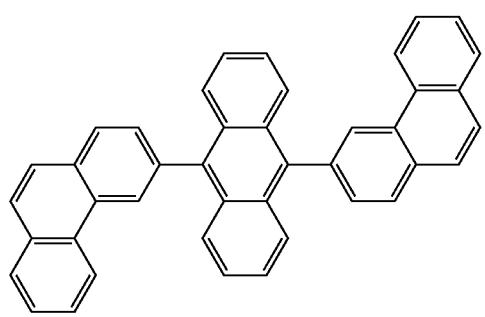

6-2

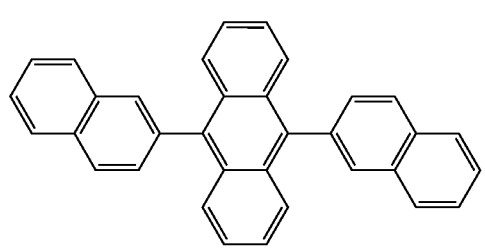

6-3

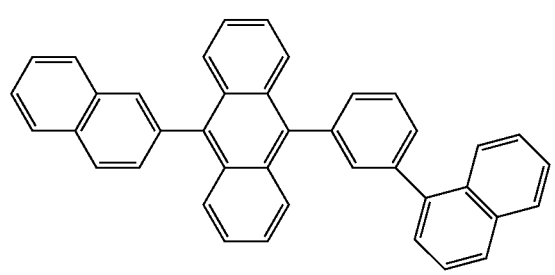

6-4

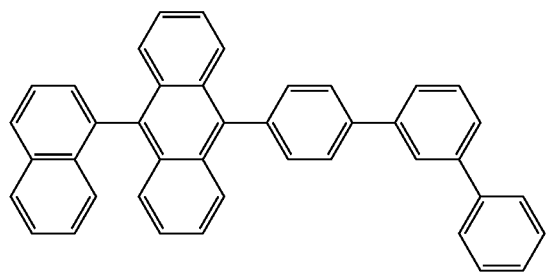

6-5

6-6

6-7

6-8

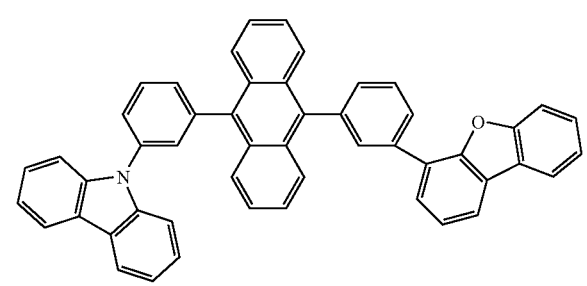

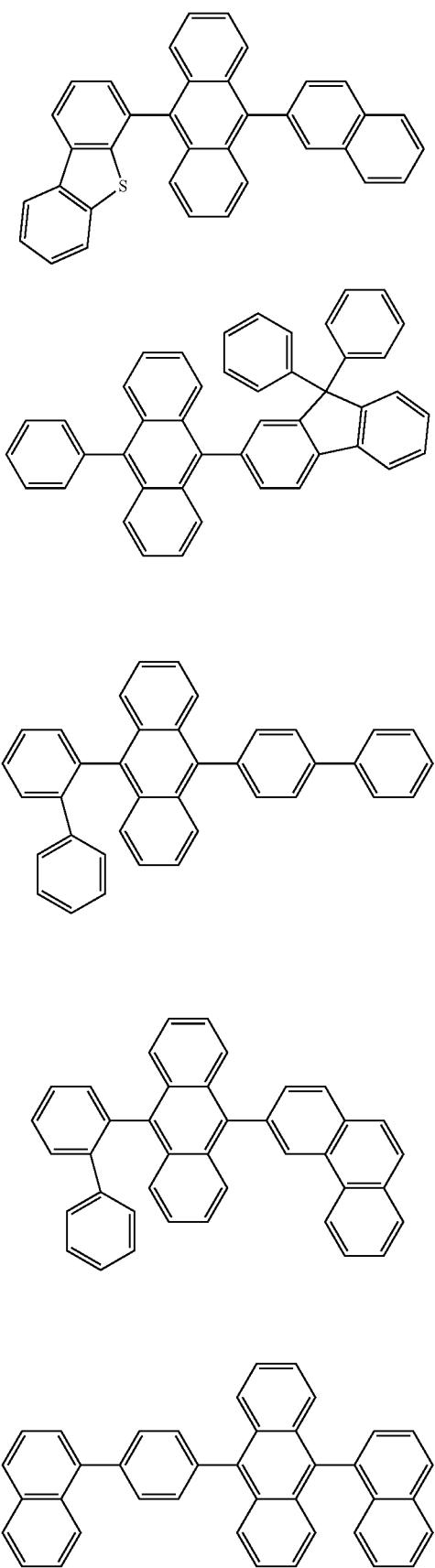

In an embodiment, the emission layer EML may include as a host material, tris(8-hydroxyquinolino)aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazol yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, embodiments of the present disclosure are not limited thereto. Any suitable host materials for emitting delayed fluorescence other than the suggested host materials may be included.

In the organic electroluminescence device 10 of an embodiment, the emission layer EML may further include any suitable dopant material. In an embodiment, the emission layer EML may include as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and/or N-(4-((E)-2-(6-((E)-4-(diphenylamino)styryl)naphthalen-2-yl)vinyl)phenyl)-N-phenylbenzenamine (N-BDAVBi), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, 1,4-bis(N,N-diphenylamino)pyrene), etc.

In addition, in an embodiment, the emission layer EML may include two different dopant materials having different lowest triplet excitation energy levels (T1 levels) from each other. In the organic electroluminescence device 10 of an embodiment, the emission layer EML may include a host having the first lowest triplet excitation energy level, a first dopant having the second lowest triplet excitation energy level which is lower than the first lowest triplet excitation energy level, and a second dopant having the third lowest triplet excitation energy level which is lower than the second lowest triplet excitation energy level. In an embodiment, the emission layer EML may include the aforementioned fused polycyclic compound of an embodiment as the first dopant.

In the organic electroluminescence device 10 of an embodiment, including the host, the first dopant and the second dopant in the emission layer EML, the first dopant may be a delayed fluorescence dopant, and the second dopant may be a fluorescence dopant. In addition, in the organic electroluminescence device 10 of an embodiment, the fused polycyclic compound represented by Formula 1 may play the role of an assistant dopant.

For example, in a case where the emission layer EML of the organic electroluminescence device 10 of an embodiment includes a plurality of dopants, the emission layer EML may include the polycyclic compound of an embodiment as the first dopant, and the aforementioned suitable dopant material as the second dopant. For example, in a case where the emission layer EML emits blue light, the emission layer EML may further include as the second dopant, any one selected from the group consisting of styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, and 1,4-bis(N,N-diphenylamino)pyrene), etc. In addition, metal complexes or organometallic complexes including Ir, Pt, Pd, etc., as a core atom such as $(4,6-F2ppy)_2Irpic$ may be used as the second dopant.

In the organic electroluminescence device 10 of an embodiment, including the fused polycyclic compound of an embodiment as the first dopant of the emission layer EML, the emission layer EML may emit green light or red light, and in this case, the second dopant material used may be the aforementioned suitable dopant, any suitable green fluorescence dopant, or any suitable red fluorescence dopant.

In the organic electroluminescence device 10 of an embodiment, the emission layer EML may be a phosphorescence emission layer. For example, the fused polycyclic compound according to an embodiment may be included in the emission layer EML as a phosphorescence host material, or a dopant material.

In the organic electroluminescence device 10 of an embodiment, as shown in FIG. 1 to FIG. 4, the electron transport region ETR is provided on the emission layer EML. The electron transport region ETR may include at least one selected from an hole blocking layer HBL, an electron transport layer ETL, and an electron injection layer EIL. However, embodiments of the present disclosure are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In addition, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, in a range from about 1,000 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport layer ETL may include an anthracene-based compound. The electron transport region may include, for example, tris(8-hydroxyquinolinato)aluminum ($Alq_3$), 1,3,5-tri[(3-pyridyl)-phen-3-yl] benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d] imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,OB)-(1,1'-biphenyl olato) aluminum (BAlq), berylliumbis(benzoquinolin-10-olate ($Bebq_2$), 9,10-di(naphthalene-2-yl)anthracene (ADN), or a mixture thereof, without limitation. The thickness of the electron transport layer ETL may be in a range from about 100 Å to about 1,000 Å and may be, for example, in a range from about 150 Å to about 500 Å. If the thickness of the electron transport layer ETL satisfies any of the above-described ranges, suitable or satisfactory electron transport properties may be obtained without substantial increase of a driving voltage.

If the electron transport region ETR includes the electron injection layer EIL, the electron transport layer ETL may include, a metal halide such as LiF, NaCl, CsF, RbCl, RbI, and/or CuI, a metal in lanthanides such as Yb, a metal oxide such as $Li_2O$ and BaO, and/or lithium quinolate (LiQ). However, embodiments of the present disclosure are not limited thereto. The electron injection layer EIL may also be formed using a mixture material of an electron transport material and an insulating organo metal salt. The organo metal salt may be a material having an energy band gap of about 4 eV or more. In some embodiments, the organo metal salt may include, for example, metal acetates, metal benzoates, metal acetoacetates, metal acetylacetonates, and/or metal stearates. The thickness of the electron injection layer EIL may be in a range from about 1 Å to about 100 Å, and in a range from about 3 Å to about 90 Å. If the thickness of the electron injection layer EIL satisfies any of the above described ranges, suitable or satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 may be a common electrode or a cathode. The second electrode EL2 may be a transmissive electrode, a transflective electrode (e.g., a semi-transmissive electrode), or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode (e.g., the semi-transmissive electrode) or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be coupled with an auxiliary electrode. If the second electrode EL2 is coupled with the auxiliary electrode, the resistance of the second electrode EL2 may decrease.

In some embodiments, the organic electroluminescence device 10 of an embodiment may further include a buffer layer between the emission layer EML and the electron transport region ETR. The buffer layer may control the concentration of excitons produced in the emission layer EML. For example, the buffer layer may include a portion of the material for the emission layer EML. The buffer layer may include the host material among the material for the emission layer EML. The lowest triplet excitation energy level of the material of the buffer layer may be controlled to the lowest triplet excitation energy level of the second dopant or more, or to the lowest triplet excitation energy level of the second dopant or less, according to the combination of the host and dopant materials included in the emission layer EML.

In some embodiments, a capping layer CPL may be further included on the second electrode EL2 of the organic electroluminescence device 10 of an embodiment. The capping layer CPL may include an organic layer and/or inorganic layer. The capping layer CPL may be a single layer of an organic layer or an inorganic layer, or a stacked layer of an organic layer and an inorganic layer in order. The capping layer may have a refractive index of about 1.6 or more in a wavelength range of about 560 nm to about 600 nm. The capping layer may include an amine compound of CPL1 or CPL2 below.

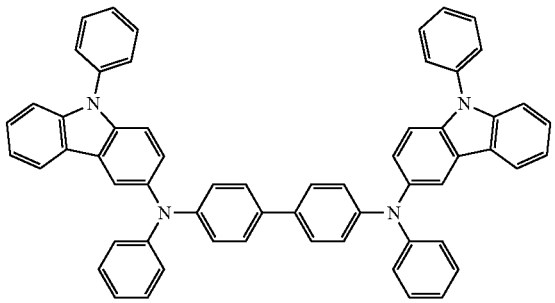

CPL1

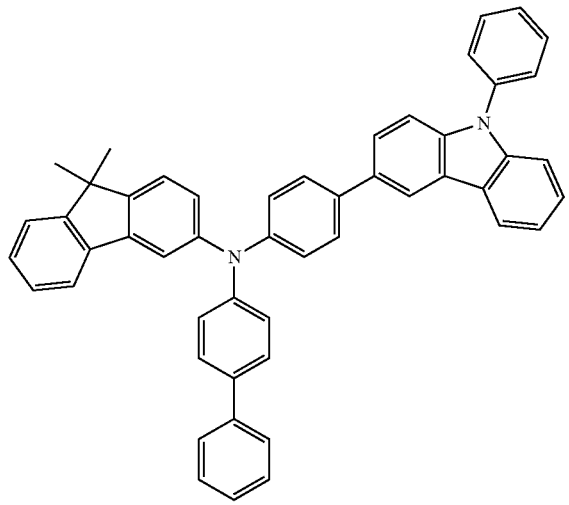

CPL2

In some embodiments, the capping layer CPL may include α-NPD, NPB, TPD, m-MTDATA, Alq₃, CuPc, N4,N4,N4',N4'-tetra(biphenyl-4-yl) biphenyl-4,4'-diamine (TPD15), 4,4',4''-tris(carbazol sol-9-yl) triphenylamine (TCTA), etc. The capping layer CPL may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

The organic electroluminescence device 10 according to an embodiment of the present disclosure includes the fused polycyclic compound of an embodiment in the emission layer EML between the first electrode EL1 and the second electrode EL2 and may show high emission efficiency properties. In addition, the fused polycyclic compound according to an embodiment may be a thermally activated delayed fluorescence dopant, and the emission layer EML may include the fused polycyclic compound of an embodiment, thereby emitting thermally activated delayed fluorescence and showing high emission efficiency.

In some embodiments, the fused polycyclic compound of an embodiment may be included in an organic layer other than the emission layer EML as a material for an organic electroluminescence device 10. For example, the organic electroluminescence device 10 according to an embodiment of the present disclosure may include the fused polycyclic compound in at least one organic layer between the first electrode EL1 and the second electrode EL2, or in a capping layer CPL on the second electrode EL2.

The fused polycyclic compound of an embodiment includes three boron atoms and has a structure in which seven aromatic rings are connected through three or four boron atoms and five heteroatoms, and has, when compared with existing compounds, a relatively low difference ($\Delta E_{ST}$) between the lowest triplet excitation energy level (T1 level) and the lowest singlet excitation energy level (S1 level). If the fused polycyclic compound is used as a material for an emission layer, the efficiency of an organic electroluminescence device may be improved.

Hereinafter, a compound according to an embodiment of the present disclosure and the organic electroluminescence device of an embodiment will be further explained referring to embodiments and comparative embodiments. The following embodiments are only illustrations to assist the understanding of the subject matter of the present disclosure, and the scope of the present disclosure is not limited thereto.

EXAMPLES

1. Synthesis of Fused Polycyclic Compound

First, the synthetic method of the fused polycyclic compound according to an embodiment will be further explained referring to the synthetic methods of Compounds 1, 6, 14, 22, 25, and 27. In addition, the synthetic methods of the fused polycyclic compounds explained below are only embodiments, and the synthetic method of the fused polycyclic compound according to embodiments of the present disclosure is not limited thereto.

(1) Synthesis of Compound 1

Fused polycyclic compound 1 according to an embodiment may be synthesized, for example, by the reaction scheme shown and described below.

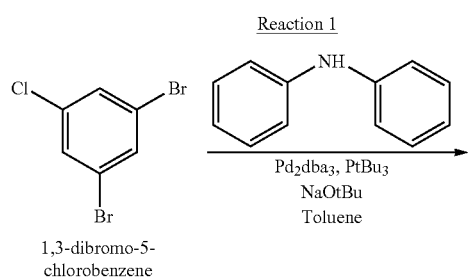

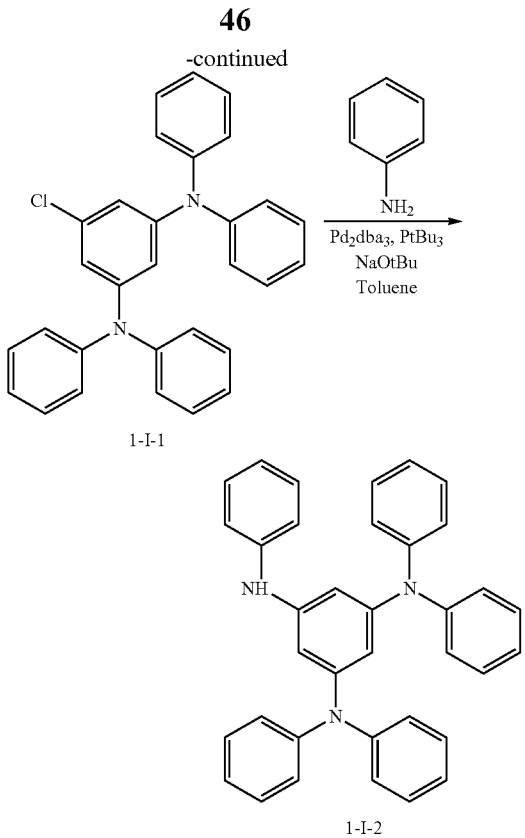

Synthesis of Intermediate 1-I-1
Under a nitrogen atmosphere, 1,3-dibromo-5-chlorobenzene (1 eq), diphenylamine (2.2 eq), Pd$_2$dba$_3$ (0.05 eq), PtBu$_3$ (0.1 eq), and NaOtBu (3 eq) were dissolved in toluene and stirred at about 120° C. for about 12 hours. After cooling, the reaction product was washed with ethyl acetate and water three times, and an organic layer was dried with anhydrous magnesium sulfate and then, dried under a reduced pressure. Then, the crude product thus obtained was separated by column chromatography to obtain Intermediate 1-I-1 (yield of 85%).

Synthesis of Intermediate 1-I-2
Under a nitrogen atmosphere, Intermediate 1-I-1 (1 eq), diphenylamine (2 eq), Pd$_2$dba$_3$ (0.05 eq), PtBu$_3$ (0.1 eq), and NaOtBu (3 eq) were dissolved in toluene and stirred at about 120° C. for about 12 hours. After cooling, the reaction product was washed with ethyl acetate and water three times, and an organic layer was dried with anhydrous magnesium sulfate and then, dried under a reduced pressure. Then, the crude product thus obtained was separated by column chromatography to obtain Intermediate 1-I-2 (yield of 90%).

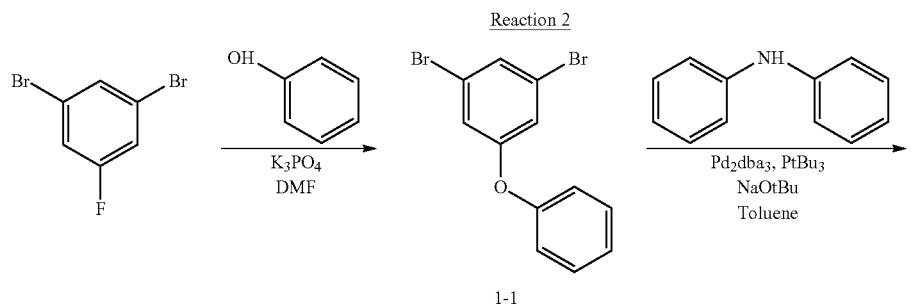

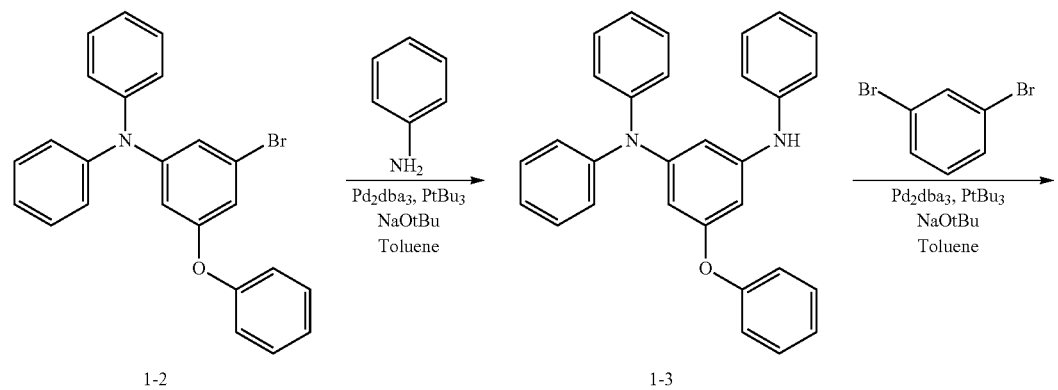
-continued
1-2   1-3
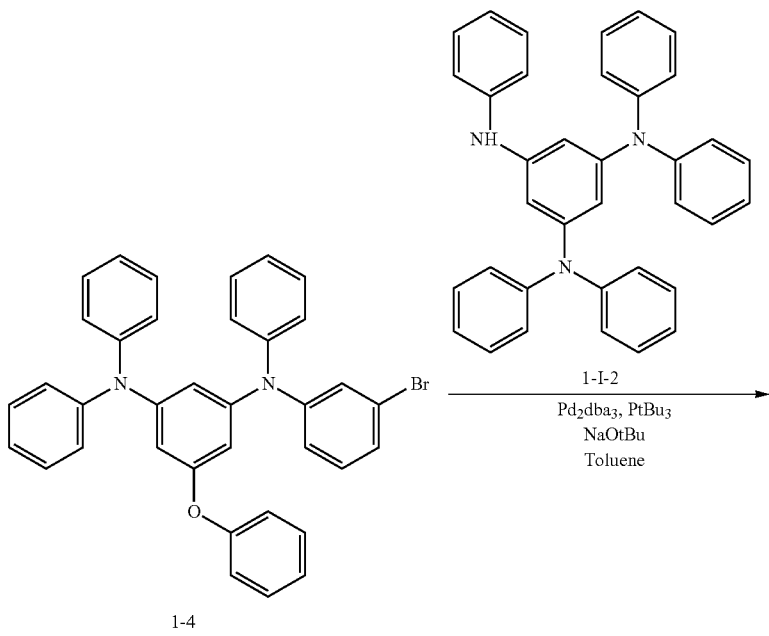
1-4
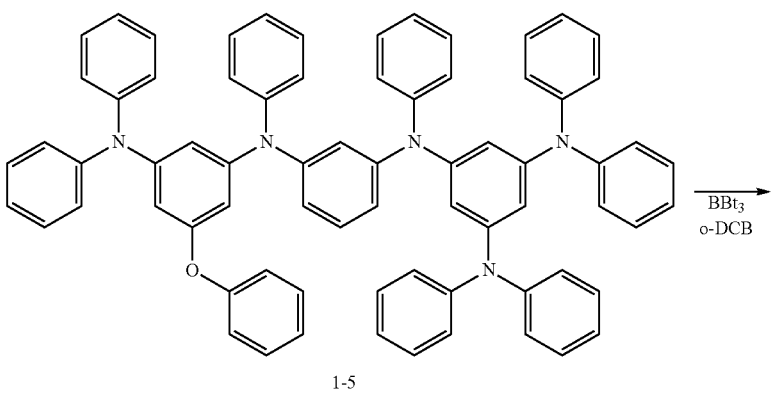
1-5

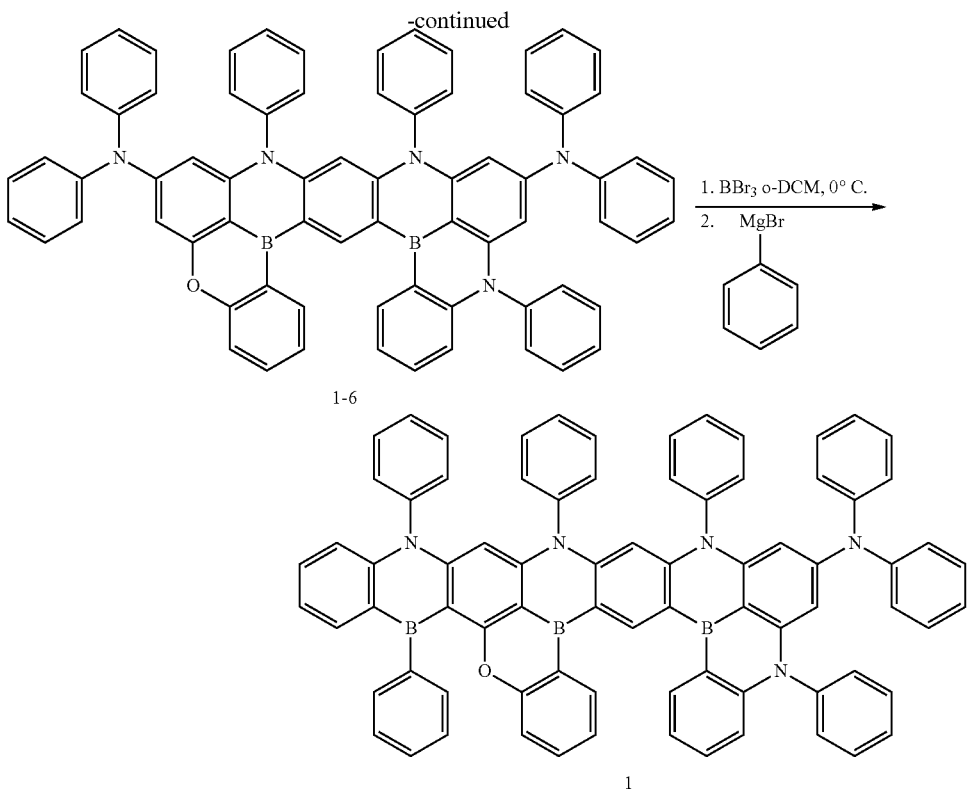

Synthesis of Intermediate 1-1

Under a nitrogen atmosphere, 1,3-dibromo-5-fluorobenzene (1 eq), phenol (1.2 eq), and $K_3PO_4$ (3 eq) were dissolved in N,N-dimethylformamide and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 1-1 (yield of 80%).

Synthesis of Intermediate 1-2

Under a nitrogen atmosphere, Intermediate 1-1 (1 eq), diphenylamine (1 eq), $Pd_2dba_3$ (0.05 eq), $PtBu_3$ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 1-2 (yield of 80%).

Synthesis of Intermediate 1-3

Under a nitrogen atmosphere, Intermediate 1-2 (1 eq), aniline (2 eq), $Pd_2dba_3$ (0.05 eq), $PtBu_3$ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 1-3 (yield of 85%).

Synthesis of Intermediate 1-4

Under a nitrogen atmosphere, Intermediate 1-3 (1 eq), 1,3-dibromobenzene (1.5 eq), $Pd_2dba_3$ (0.05 eq), $PtBu_3$ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 1-4 (yield of 80%).

Synthesis of Intermediate 1-5

Under a nitrogen atmosphere, Intermediate 1-4 (1 eq), Intermediate 1-1-2 (1 eq), $Pd_2dba_3$ (0.05 eq), $PtBu_3$ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 1-5 (yield of 55%).

Synthesis of Intermediate 1-6

Under a nitrogen atmosphere, Intermediate 1-5 (1 eq), and boron tribromide (6 eq) were dissolved in o-dichlorobenzene and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 1-6 (yield of 7%).

Synthesis of Compound 1

Under a nitrogen atmosphere, Intermediate 1-6 (1 eq), and boron tribromide (3 eq) were dissolved in o-dichlorobenzene and stirred at about 0° C. for about 1 hour. After cooling, phenylmagnesium bromide (1.5 eq) was added dropwise to the resultant solution, which was then stirred at room temperature for about 12 hours. Then, the reaction product was washed with ethyl acetate and water three times, and an organic layer obtained was dried with anhydrous magnesium sulfate and then, dried under a reduced pressure. Then, the crude product thus obtained was separated by column chromatography to obtain Compound 1 (yield of 7%).

(2) Synthesis of Compound 6

Fused polycyclic compound 6 according to an embodiment may be synthesized, for example, by the reaction scheme shown and described below.

Reaction 3

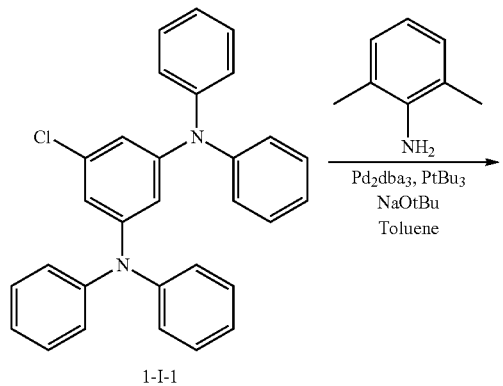

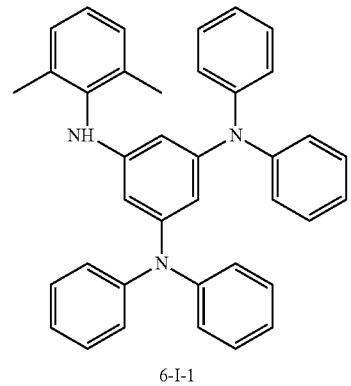

6-I-1

Synthesis of Intermediate 6-1-1

Under a nitrogen atmosphere, Intermediate 1-1-1 (1 eq), 2,6-dimethylaniline (2 eq), Pd$_2$dba$_3$ (0.05 eq), PtBu$_3$ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 6-1-1 (yield of 70%).

Reaction 4

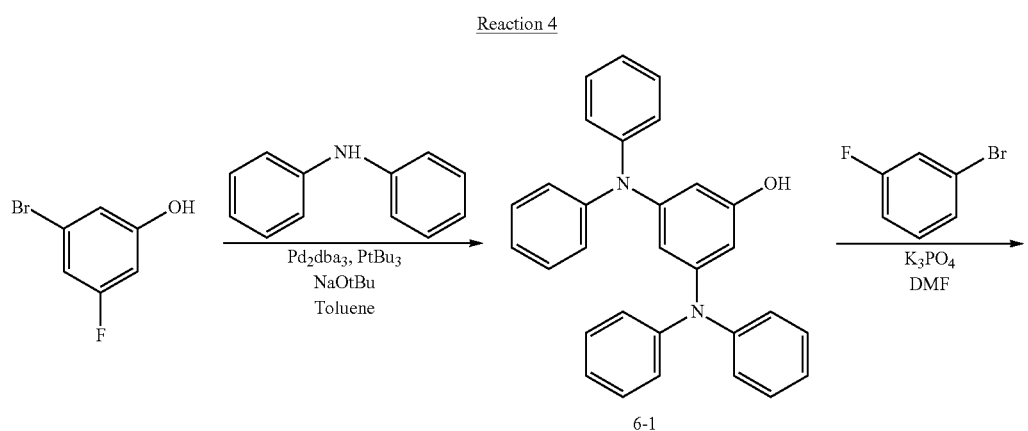

6-1

-continued
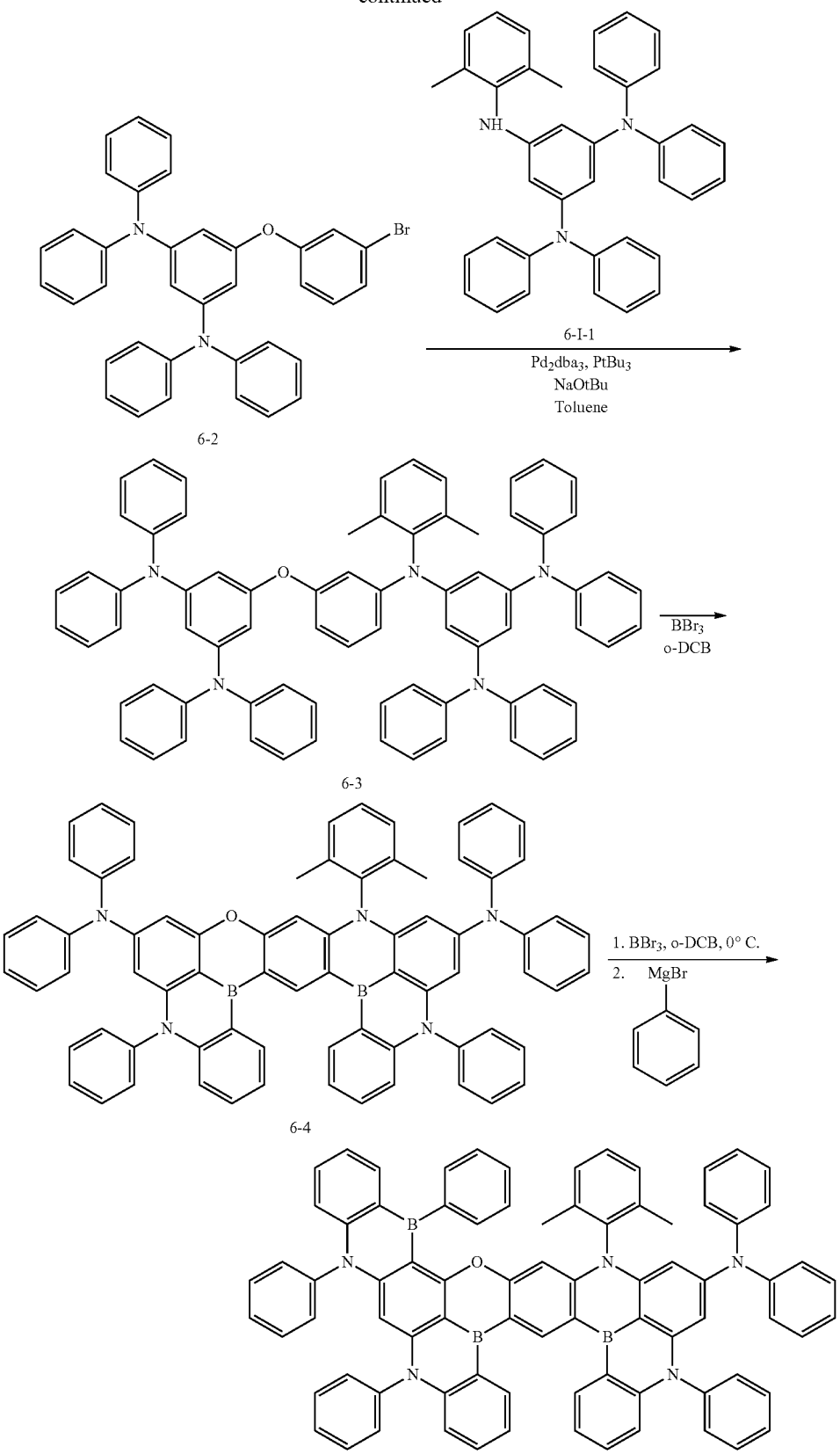

Synthesis of Intermediate 6-1

Under a nitrogen atmosphere, 3,5-dibromophenol (1 eq), diphenylamine (2.2 eq), Pd$_2$dba$_3$ (0.1 eq), PtBu$_3$ (0.2 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 6-1 (yield of 80%).

Synthesis of Intermediate 6-2

Under a nitrogen atmosphere, Intermediate 6-1 (1 eq), 1-bromo fluorobenzene (1.2 eq), and K$_3$PO$_4$ (3 eq) were dissolved in N,N-dimethylformamide and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 6-2 (yield of 70%).

Synthesis of Intermediate 6-3

Under a nitrogen atmosphere, Intermediate 6-2 (1 eq), Intermediate 6-1-1 (1 eq), Pd$_2$dba$_3$ (0.1 eq), PtBu$_3$ (0.2 eq), and NaOtBu (3 eq) were dissolved in toluene and stirred at about 110° C. for about 12 hours. After cooling, the reaction product was washed with ethyl acetate and water three times, and an organic layer was dried with anhydrous magnesium sulfate and then, dried under a reduced pressure. Then, the crude product thus obtained was separated by column chromatography to obtain Intermediate 6-3 (yield of 50%).

Synthesis of Intermediate 6-4

Under a nitrogen atmosphere, Intermediate 6-3 (1 eq), and boron tribromide (6 eq) were dissolved in o-dichlorobenzene and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 6-4 (yield of 5%).

Synthesis of Compound 6

Under a nitrogen atmosphere, Intermediate 6-4 (1 eq), and boron tribromide (3 eq) were dissolved in o-dichlorobenzene and stirred at about 0° C. for about 1 hour. Then, phenylmagnesium bromide (1.5 eq) was added dropwise to the resultant solution, which was then stirred at room temperature for about 12 hours. Then, the reaction product was washed with ethyl acetate and water three times, and an organic layer obtained was dried with anhydrous magnesium sulfate and then, dried under a reduced pressure. Then, the crude product thus obtained was separated by column chromatography to obtain Compound 6 (yield of 5%).

(3) Synthesis of Compound 14

Fused polycyclic compound 14 according to an embodiment may be synthesized, for example, by the reaction scheme shown and described below.

Reaction 5

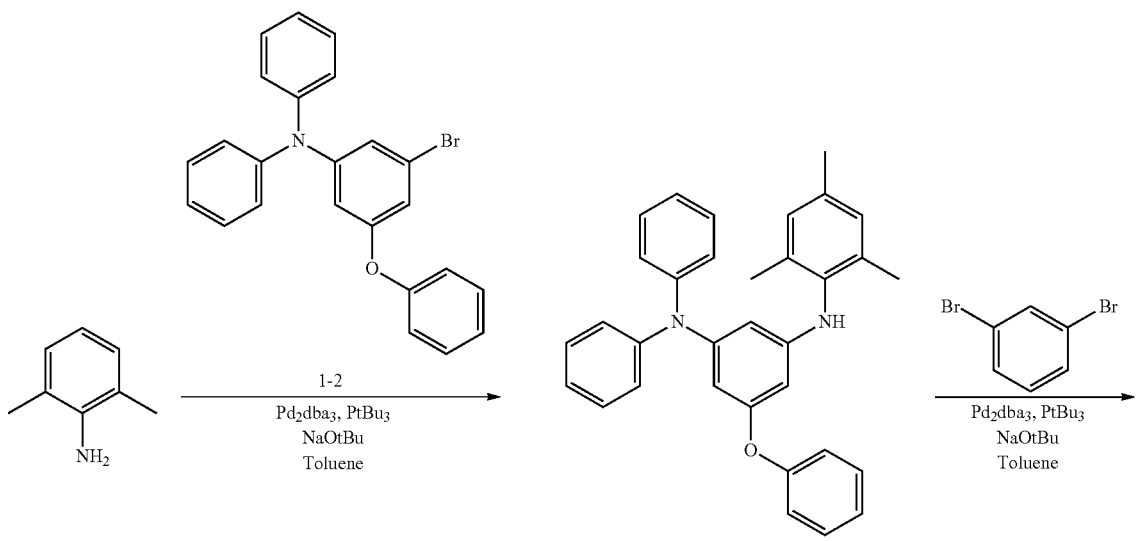

14-1

-continued
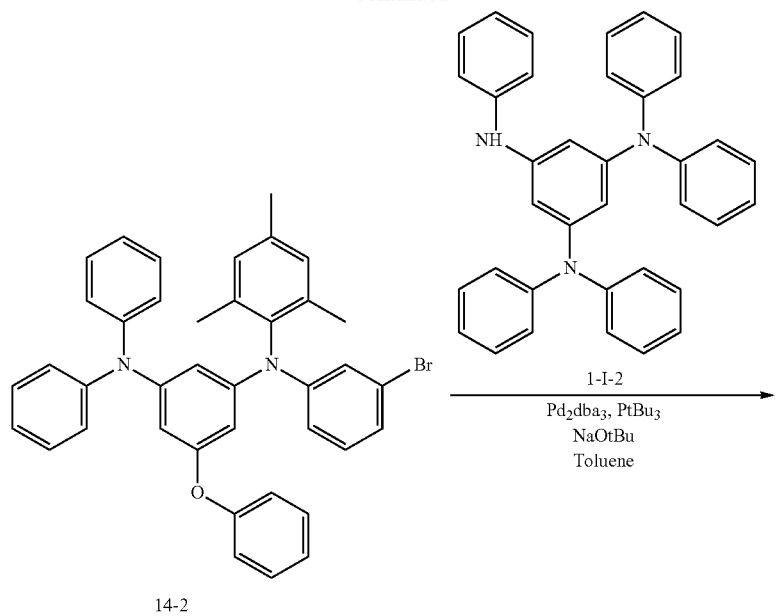
14-2
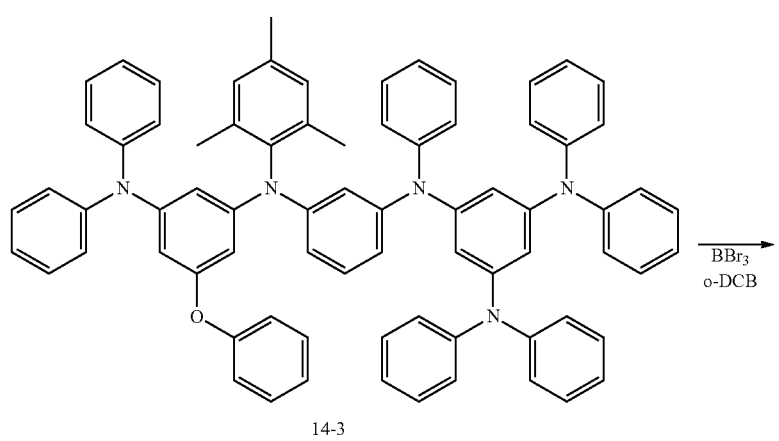
14-3
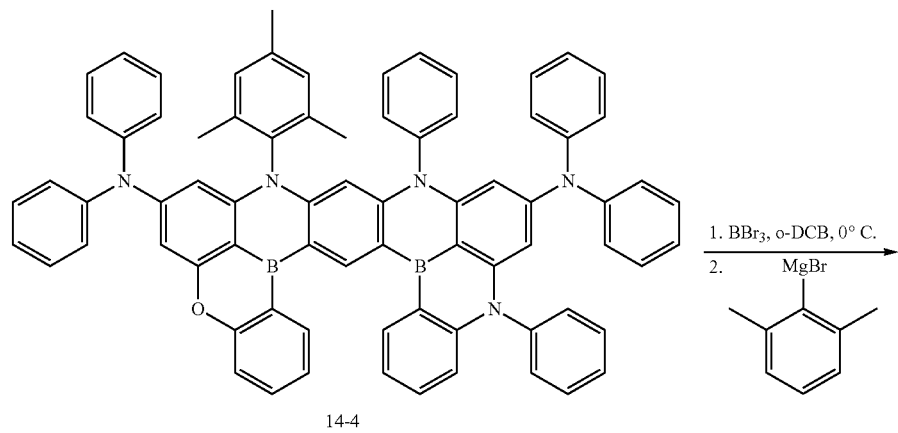
14-4

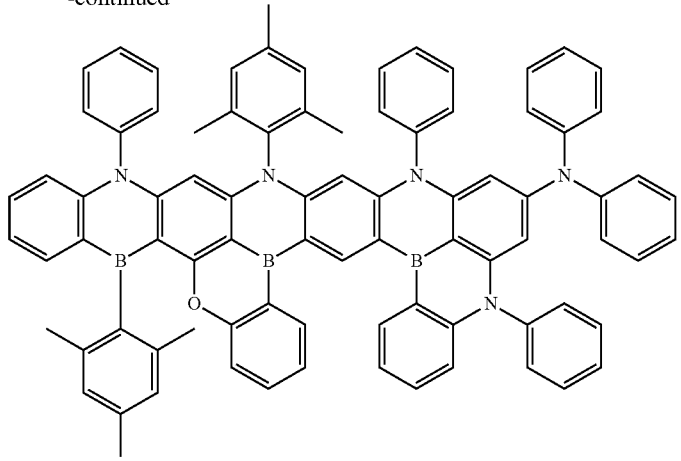

14

Synthesis of Intermediate 14-1

Under a nitrogen atmosphere, Intermediate 1-2 (1 eq), 2,6-dimethylaniline (2 eq), Pd₂dba₃ (0.05 eq), PtBu₃ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 14-1 (yield of 80%).

Synthesis of Intermediate 14-2

Under a nitrogen atmosphere, Intermediate 14-1 (1 eq), 1,3-dibromobenzene (2 eq), Pd₂dba₃ (0.05 eq), PtBu₃ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 14-2 (yield of 70%).

Synthesis of Intermediate 14-3

Under a nitrogen atmosphere, Intermediate 14-2 (1 eq), Intermediate 1-1-2 (1.2 eq), Pd₂dba₃ (0.05 eq), PtBu₃ (0.1 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 14-3 (yield of 65%).

Synthesis of Intermediate 14-4

Under a nitrogen atmosphere, Intermediate 14-3 (1 eq), and boron tribromide (6 eq) were dissolved in o-dichlorobenzene and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 14-4 (yield of 6%).

Synthesis of Compound 14

Under a nitrogen atmosphere, Intermediate 14-4 (1 eq), and boron tribromide (3 eq) were dissolved in o-dichlorobenzene and stirred at about 0° C. for about 1 hour. Then, 2,6-dimethylphenylmagnesium bromide (1.5 eq) was added dropwise to the resultant solution, which was then stirred at room temperature for about 12 hours. Then, the reaction product was washed with ethyl acetate and water three times, and an organic layer was dried with anhydrous magnesium sulfate and then, dried under a reduced pressure. Then, the crude product thus obtained was separated by column chromatography to obtain Compound 14 (yield of 4%).

(4) Synthesis of Compound 22

Fused polycyclic compound 22 according to an embodiment may be synthesized, for example, by the reaction scheme shown and described below. Reaction 6

Reaction 6

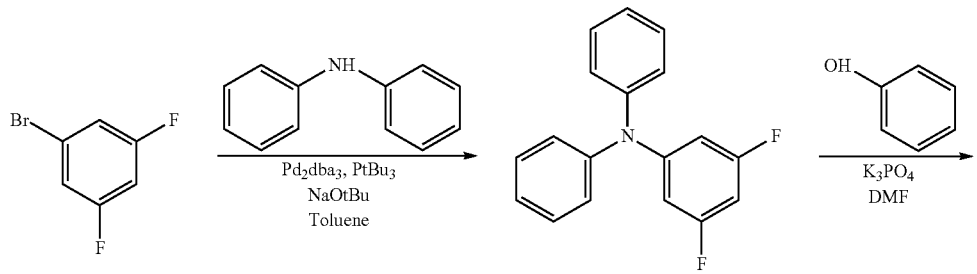

22-1

-continued
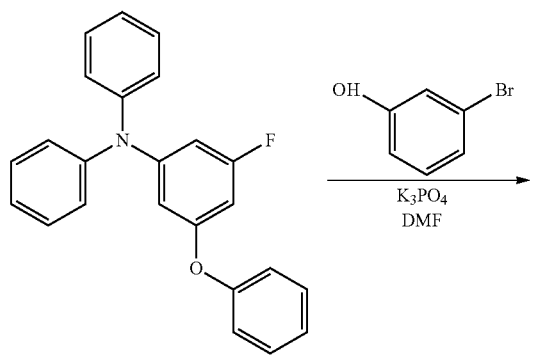
22-2
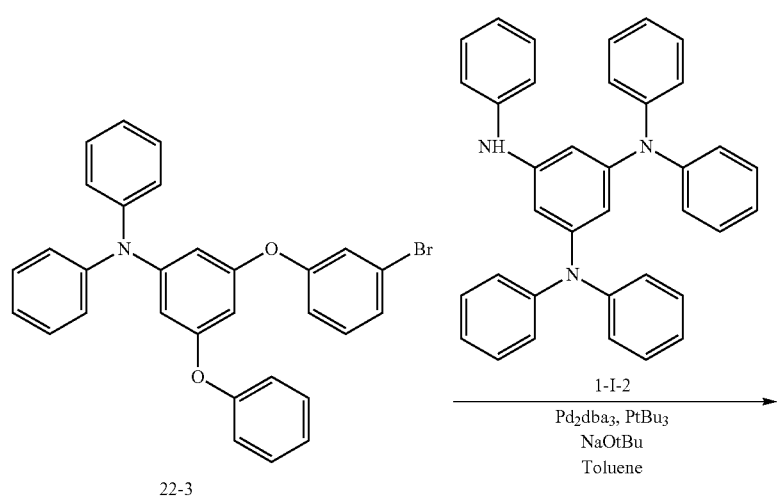
22-3
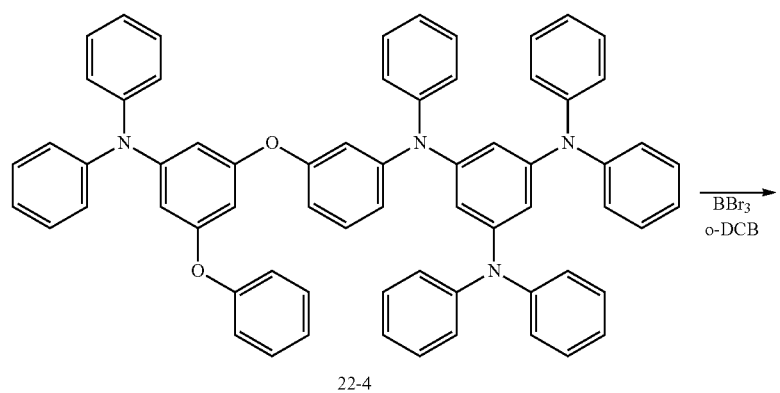
22-4
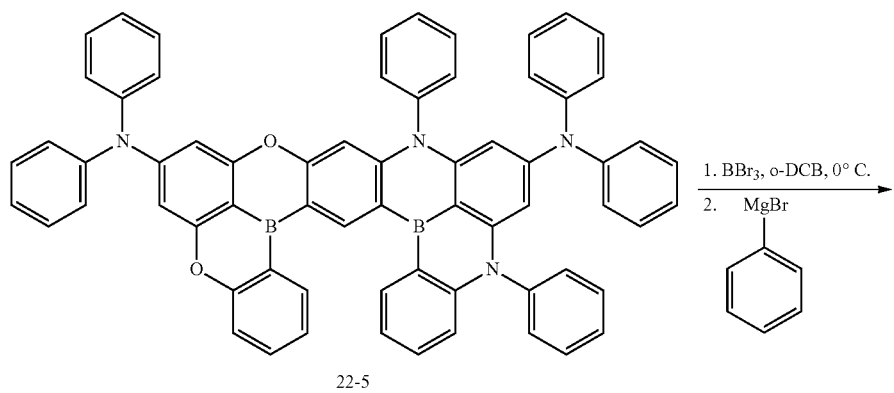
22-5

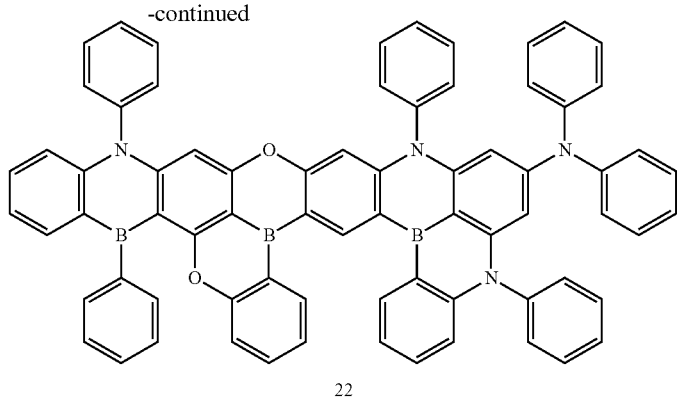

22

Synthesis of Intermediate 22-1

Under a nitrogen atmosphere, 1-bromo-3,5-difluorobenzene (1 eq), diphenylamine (1.2 eq), Pd$_2$dba$_3$ (0.1 eq), PtBu$_3$ (0.2 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 22-1 (yield of 85%).

Synthesis of Intermediate 22-2

Under a nitrogen atmosphere, Intermediate 22-1 (1.1 eq), phenol (1 eq), and K$_3$PO$_4$ (2 eq) were dissolved in N,N-dimethylformamide and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 22-2 (yield of 75%).

Synthesis of Intermediate 22-3

Under a nitrogen atmosphere, Intermediate 22-2 (1 eq), 3-bromophenol (1.2 eq), and K$_3$PO$_4$ (3 eq) were dissolved in N,N-dimethylformamide and stirred at about 160° C. for about 12 hours. After cooling, the reaction product was washed with ethyl acetate and water three times, and an organic layer was dried with anhydrous magnesium sulfate and then, dried under a reduced pressure. Then, the crude product thus obtained was separated by column chromatography to obtain Intermediate 22-3 (yield of 70%).

Synthesis of Intermediate 22-4

Under a nitrogen atmosphere, Intermediate 22-3 (1 eq), Intermediate 1-1-2 (1.2 eq), Pd$_2$dba$_3$ (0.1 eq), PtBu$_3$ (0.2 eq), and NaOtBu (3 eq) were dissolved in toluene and stirred at about 110° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 22-4 (yield of 65%).

Synthesis of Intermediate 22-5

Under a nitrogen atmosphere, Intermediate 22-4 (1 eq), and boron tribromide (6 eq) were dissolved in o-dichlorobenzene and stirred at about 160° C. for about 12 hours. After cooling, the reaction product was washed with ethyl acetate and water three times, and an organic layer was dried with anhydrous magnesium sulfate and then, dried under a reduced pressure. Then, the crude product thus obtained was separated by column chromatography to obtain Intermediate 22-5 (yield of 3%).

Synthesis of Compound 22

Under a nitrogen atmosphere, Intermediate 22-5 (1 eq), and boron tribromide (3 eq) were dissolved in o-dichlorobenzene and stirred at about 0° C. for about 1 hour. Then, phenylmagnesium bromide (1.5 eq) was added dropwise to the resultant solution, which was then stirred at room temperature for about 12 hours. Then, the reaction product was washed with ethyl acetate and water three times, and an organic layer obtained was dried with anhydrous magnesium sulfate and then, dried under a reduced pressure. Then, the crude product thus obtained was separated by column chromatography to obtain Compound 22 (yield of 5%).

(5) Synthesis of Compound 25

Fused polycyclic compound 25 according to an embodiment may be synthesized, for example, by the reaction scheme shown and described below.

Reaction 7
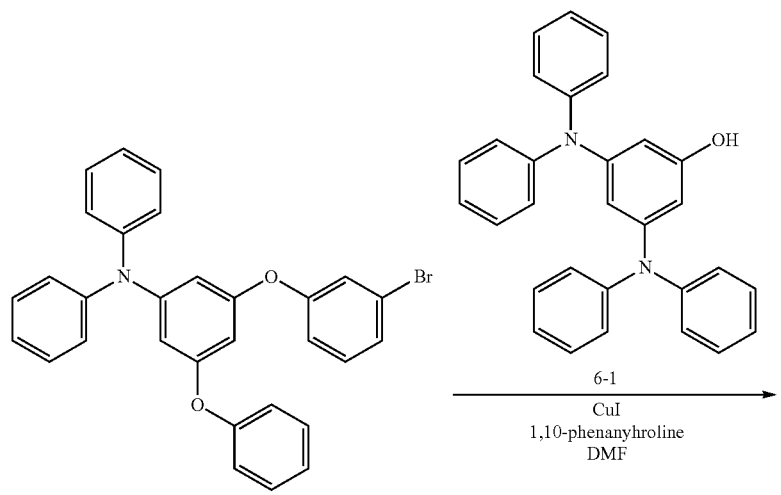
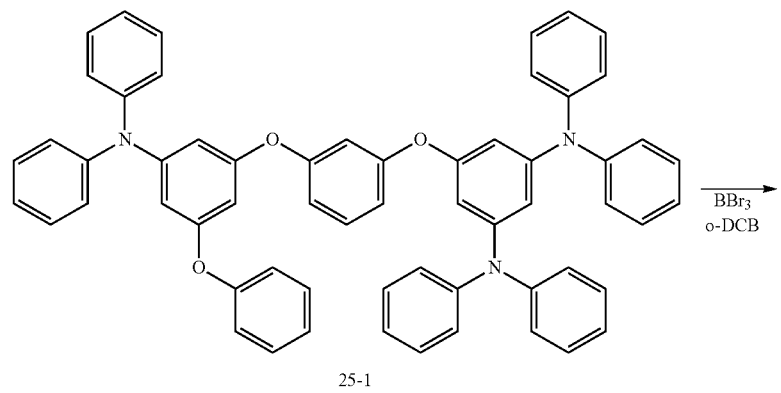
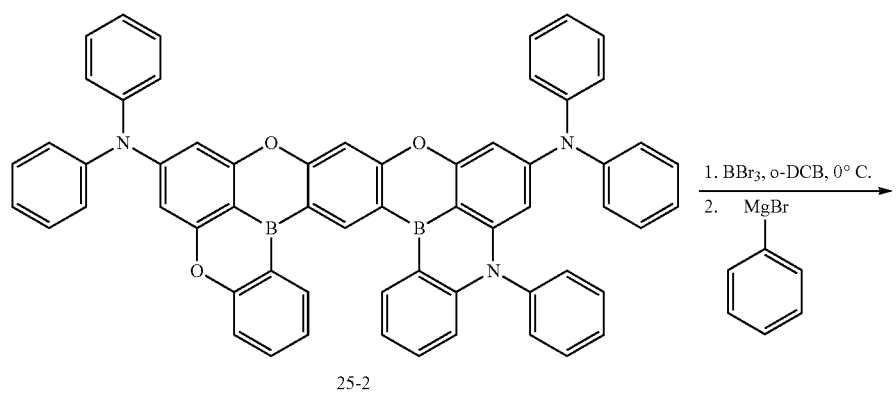

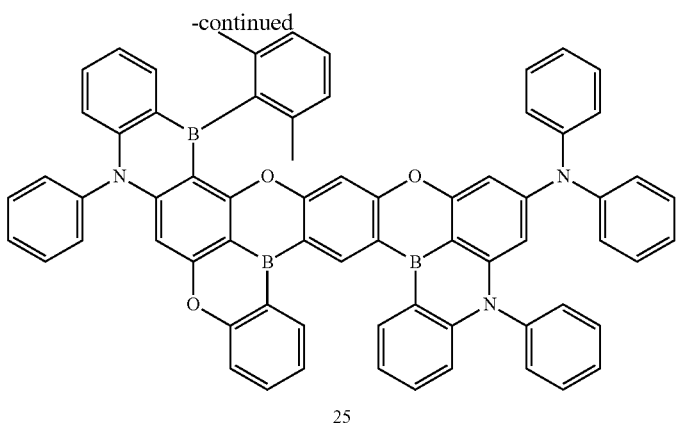

25

Synthesis of Intermediate 25-1

Under a nitrogen atmosphere, Intermediate 22-3 (1 eq), Intermediate 6-1 (1 eq), CuI (0.1 eq), and 1,10-phenanthroline (0.2 eq) were dissolved in N,N-dimethylformamide and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 25-1 (yield of 55%).

Synthesis of Intermediate 25-2

Under a nitrogen atmosphere, Intermediate 25-1 (1 eq), and boron tribromide (6 eq) were dissolved in o-dichlorobenzene and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 25-2 (yield of 3%).

Synthesis of Compound 25

Under a nitrogen atmosphere, Intermediate 25-2 (1 eq), and boron tribromide (3 eq) were dissolved in o-dichlorobenzene and stirred at about 0° C. for about 1 hour. Then, phenylmagnesium bromide (1.5 eq) was added dropwise to the resultant solution, which was then stirred at room temperature for about 12 hours. Then, the reaction product was washed with ethyl acetate and water three times, and an organic layer obtained was dried with anhydrous magnesium sulfate and then, dried under a reduced pressure. Then, the crude product thus obtained was separated by column chromatography to obtain Compound 25 (yield of 4%).

(6) Synthesis of Compound 27

Fused polycyclic compound 27 according to an embodiment may be synthesized, for example, by the reaction scheme shown and described below.

Reaction 8

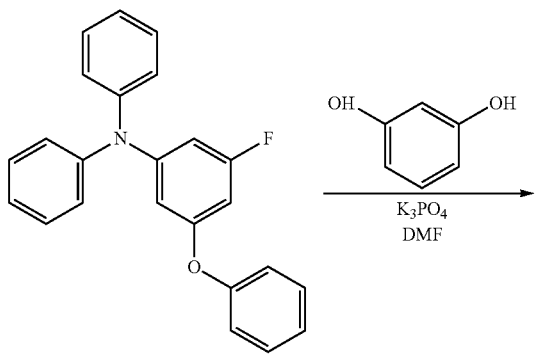

25-2

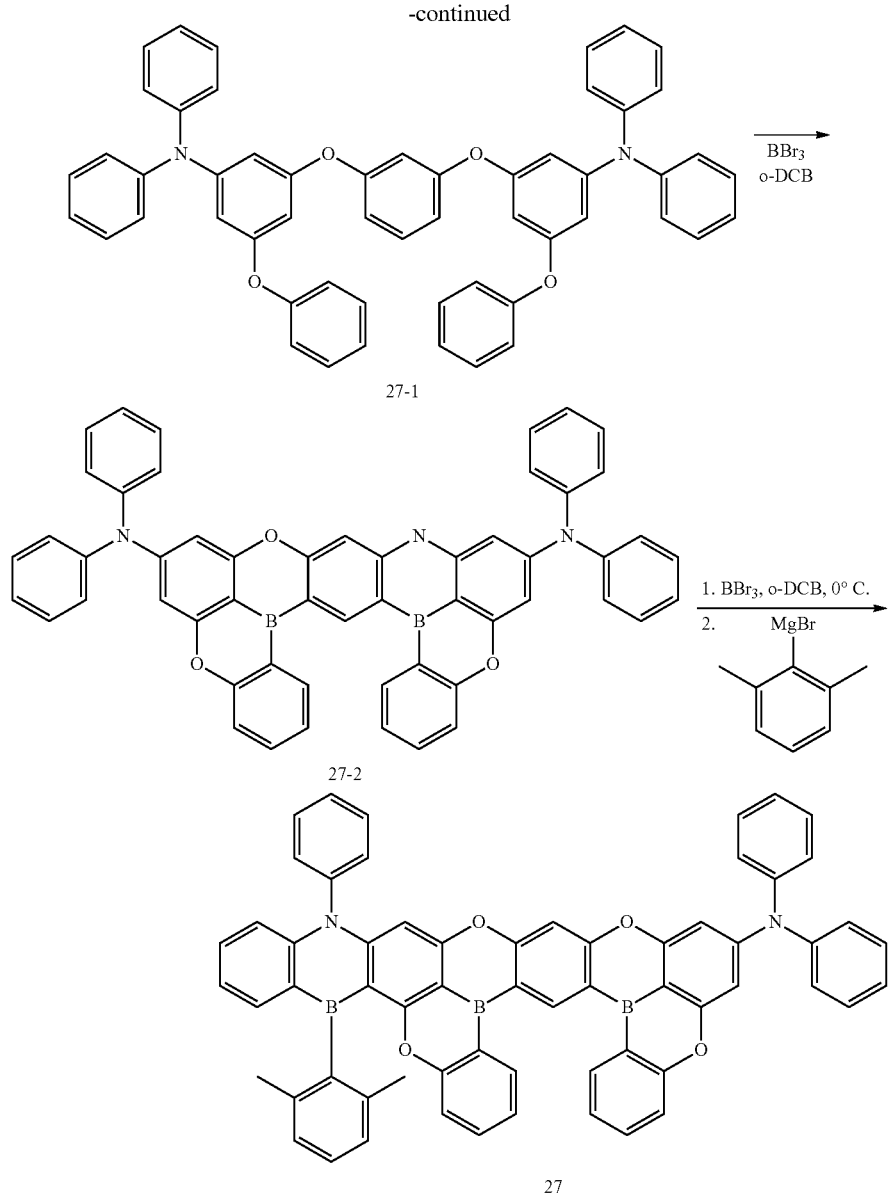

Synthesis of Intermediate 27-1

Under a nitrogen atmosphere, Intermediate 25-2 (2.2 eq), resorcinol (1 eq), and $K_3PO_4$ (5 eq) were dissolved in N,N-dimethylformamide and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 27-1 (yield of 45%).

Synthesis of Intermediate 27-2

Under a nitrogen atmosphere, Intermediate 27-1 (1 eq), and boron tribromide (6 eq) were dissolved in o-dichlorobenzene and stirred at about 160° C. for about 12 hours. After cooling, the reaction product was washed with ethyl acetate and water three times, and an organic layer obtained was dried with anhydrous magnesium sulfate and then, dried under a reduced pressure. Then, the crude product thus obtained was separated by column chromatography to obtain Intermediate 27-2 (yield of 2%).

Synthesis of Compound 27

Under a nitrogen atmosphere, Intermediate 27-2 (1 eq), and boron tribromide (3 eq) were dissolved in o-dichlorobenzene and stirred at about 0° C. for about 1 hour. Then, 2,6-dimethylphenylmagnesium bromide (1.5 eq) was added dropwise to the resultant solution, which was then stirred at room temperature for about 12 hours. Then, the reaction product was washed with ethyl acetate and water three times, and an organic layer obtained was dried with anhydrous magnesium sulfate and then, dried under a reduced pressure. Then, the crude product thus obtained was separated by column chromatography to obtain Compound 27 (yield of 4%).

2. Evaluation of Energy Levels of Fused Polycyclic Compounds

Energy levels, etc. of Example Compounds 1, 6, 14, 22, 25, and 27 below, and Comparative Compound C1, were evaluated. The Example Compounds and Comparative Compound, evaluating the energy levels, etc. are as follows.

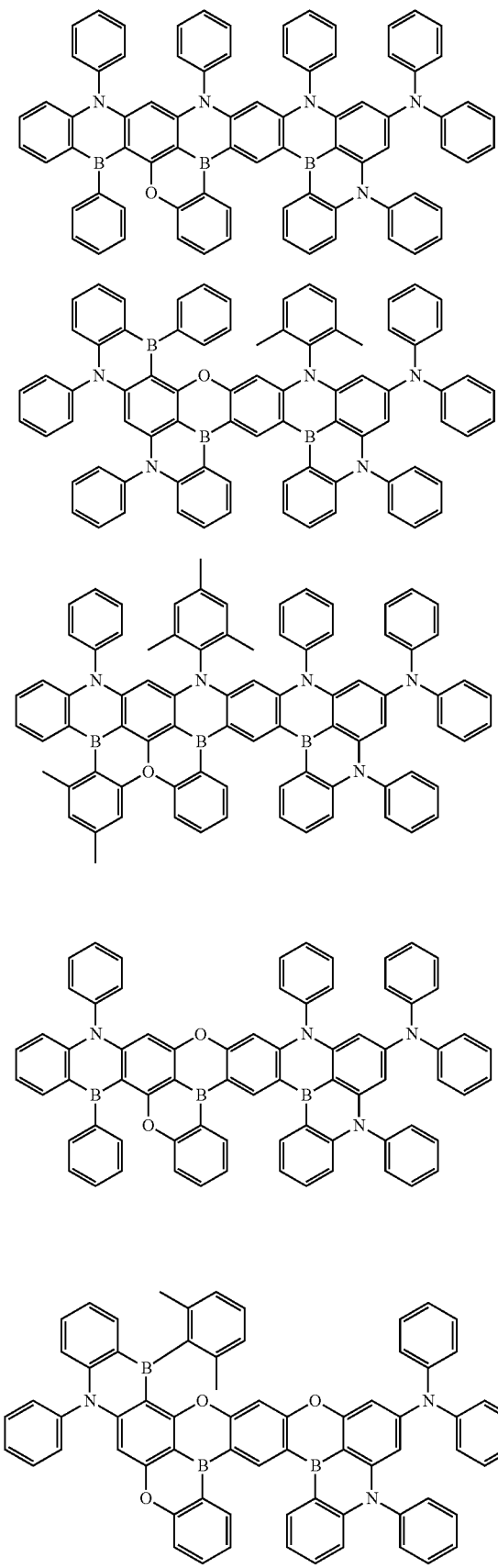

In Table 1 below, the HOMO level, the LUMO level, the lowest singlet excitation energy level (S1 level), the lowest triplet excitation energy level (T1 level), the dipole momentum, the oscillator strength (OSC) and the $\Delta E_{ST}$ of Compounds 1, 6, 14, 22, 25, and 27, which are Example Compounds, and Comparative Compound C1, are shown. In Table 1, energy level values were calculated by a non-empirical molecular orbital method, particularly, they were calculated utilizing the Gaussian 09 software package of Gaussian Co. where the calculations were density functional theory (DFT) calculations performed utilizing the B3LYP hybrid functional and 6-31G(d) basis set (B3LYP/6-31G (d)). In Table 1, $\Delta E_{ST}$ shows a difference between the lowest singlet excitation energy level (S1 level) and the lowest triplet excitation energy level (T1 level).

TABLE 1

| Compound type | HOMO | LUMO | S1 level (eV) | T1 level (eV) | Dipole | OSC | $\Delta E_{ST}$ (eV) |
| --- | --- | --- | --- | --- | --- | --- | --- |
| Compound 1 | −4.739 | −1.295 | 2.949 | 2.620 | 7.926 | 0.579 | 0.329 |
| Compound 6 | −4.708 | −1.519 | 2.657 | 2.310 | 5.848 | 0.136 | 0.347 |
| Compound 14 | −4.721 | −1.244 | 2.974 | 2.651 | 7.665 | 0.576 | 0.324 |
| Compound 22 | −4.841 | −1.425 | 2.947 | 2.618 | 6.462 | 0.572 | 0.329 |
| Compound 25 | −5.004 | −1.637 | 3.003 | 2.683 | 2.923 | 0.443 | 0.320 |
| Compound 27 | −5.158 | −1.763 | 2.995 | 2.676 | 3.644 | 0.604 | 0.319 |
| Comparative Compound C1 | −5.105 | −1.786 | 2.722 | 2.711 | 4.010 | 0.001 | 0.011 |

It can be seen from Table 1 that Compounds 1, 6, 14, 22, 25, and 27, which are Example Compounds, showed higher oscillator strength values than Comparative Compound C1. It can also be seen that Compounds 1, 6, 14, 22, 25, and 27, which are Example Compounds, all showed relatively small values of $\Delta E_{ST}$ of about 0.33 eV or less and high oscillator strength values to improve light absorption characteristics, and accordingly, may be used as thermally activated delayed fluorescence dopant materials.

3. Manufacture and Evaluation of Organic Electroluminescence Device Including Fused Polycyclic Compound Manufacture of organic electroluminescence devices Organic electroluminescence devices of embodiments including the fused polycyclic compound of an embodiment in an emission layer were manufactured by a method below. Organic electroluminescence devices of Example 1 to Example 12 were manufactured using the fused polycyclic compounds of Compounds 1, 6, 14, 22, 25, and 27, which are Example Compounds as the dopant materials and host materials of an emission layer. Comparative Example 1 to Comparative Example 5 correspond to organic electroluminescence devices manufactured using Comparative Compound C1 to Comparative Compound C5 as the dopant materials of an emission layer.

In order to form a first electrode, ITO was patterned to a thickness of about 1,200 Å on a glass substrate to form a first electrode, ultrasonic wave washing was performed using isopropyl alcohol and pure water for about 5 minutes, respectively, and washing was performed by irradiating ultraviolet rays and ozone for about 30 minutes. On the glass substrate on which ITO was formed, NPD was vacuum deposited to a thickness of about 300 Å to form a hole injection layer, and then, an amine compound represented by Formula HT1 or Formula HT9 below, or a hole transport compound TCTA was vacuum deposited to a thickness of about 200 Å to form a hole transport layer. On the hole transport layer, mCP and the Example Compound of the present disclosure, or two types (or kinds) of the Example Compounds of the present disclosure, or mCP and the Comparative Compound, were deposited at the same time to a weight ratio of 99:1 to form an emission layer with a thickness of about 200 Å. Then, a compound for an electron transport layer, TSPO1 was formed to a thickness of about 200 Å, and a compound for an electron injection layer, TPBi was deposited to a thickness of about 300 Å. On the electron transport layer, an alkali metal halide, LiF was deposited to a thickness of about 10 Å, and Al was vacuum deposited to a thickness of about 3,000 Å to form a LiF/Al second electrode. Then, on the second electrode, a capping layer was formed using CPL1 to a thickness of about 700 Å to manufacture an organic electroluminescence device.

The compounds used for the manufacture of the organic electroluminescence devices of the Examples and Comparative Examples are shown below.

1

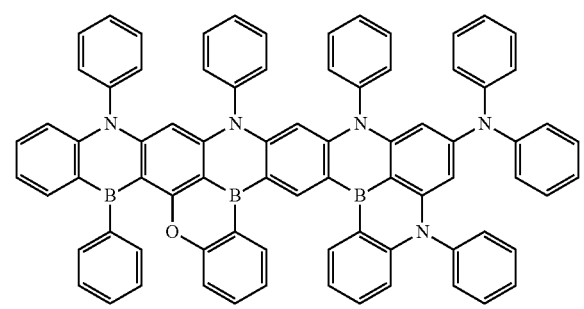

6

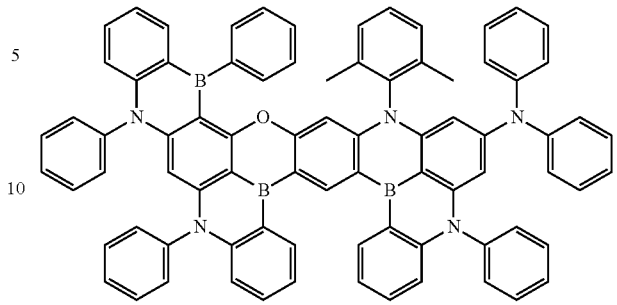

14

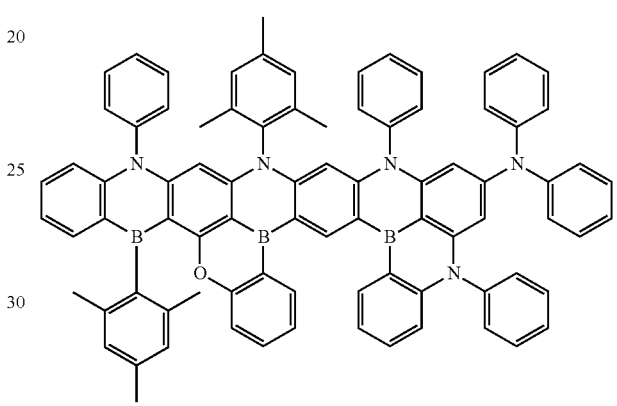

22

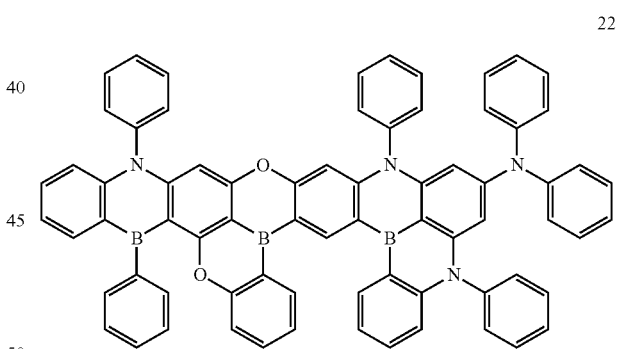

27

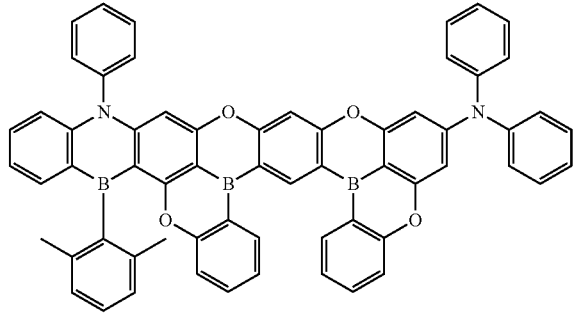

75
-continued
C1
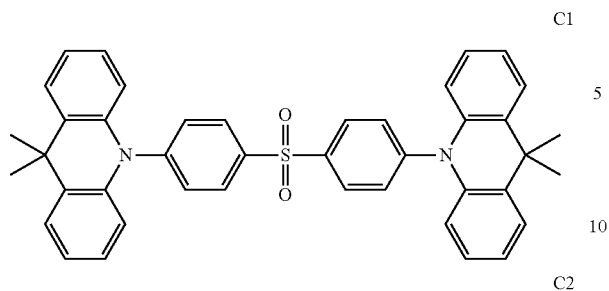
C2
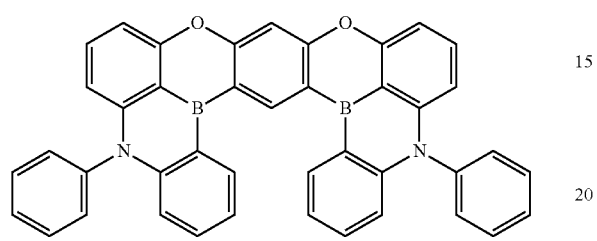
C3
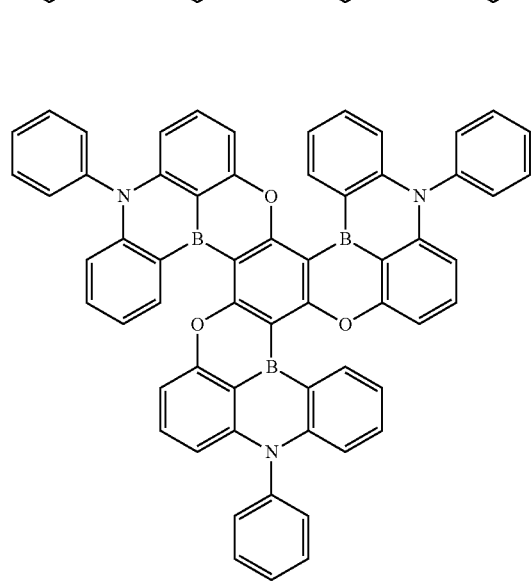
C4
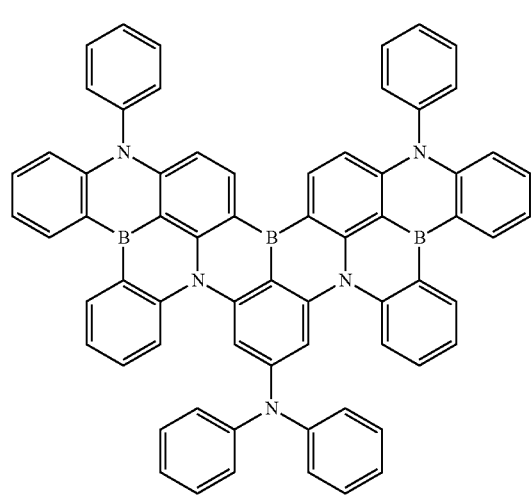
76
-continued
C5
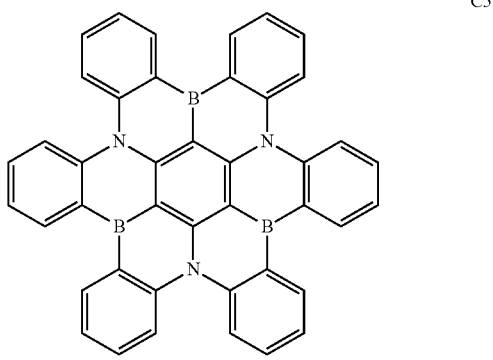
HT1
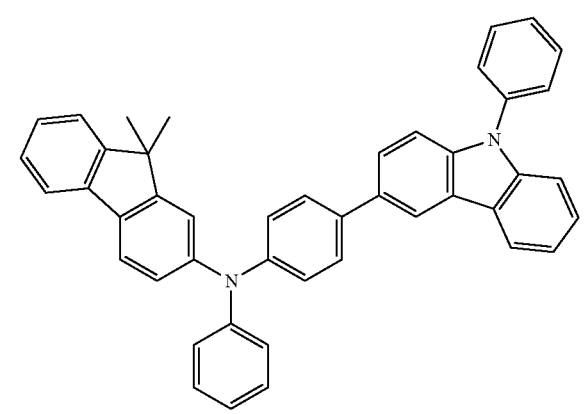
HT9
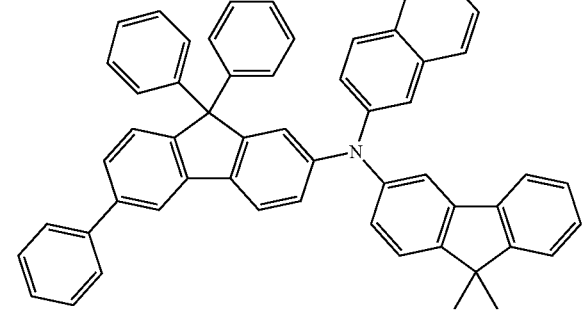
NPD
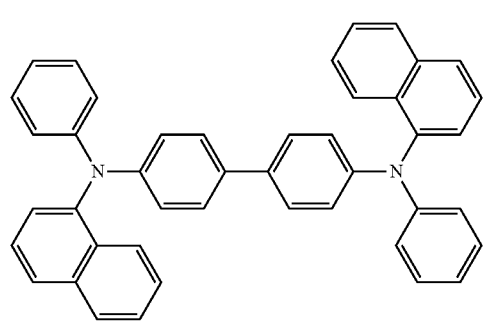

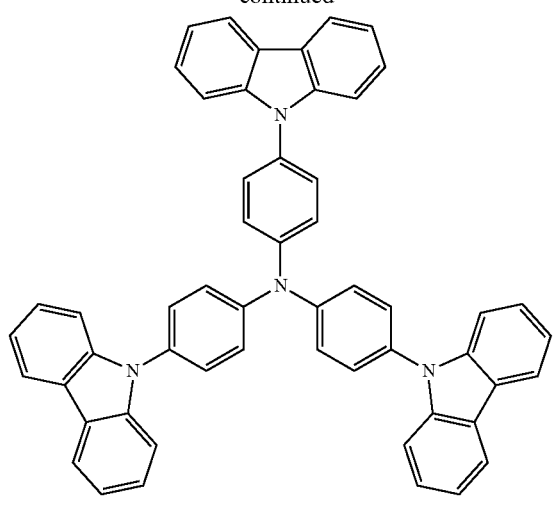

TCTA

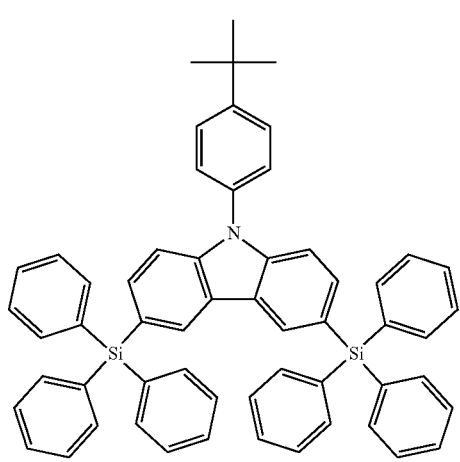

CzSi

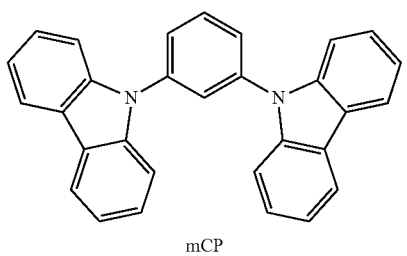

mCP

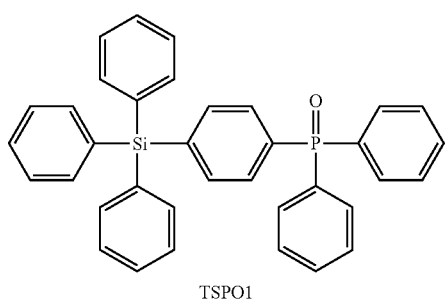

TSPO1

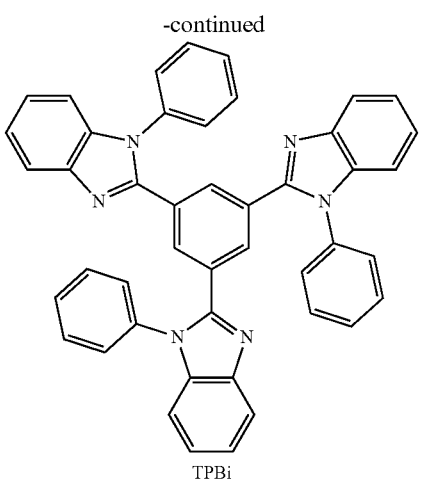

TPBi

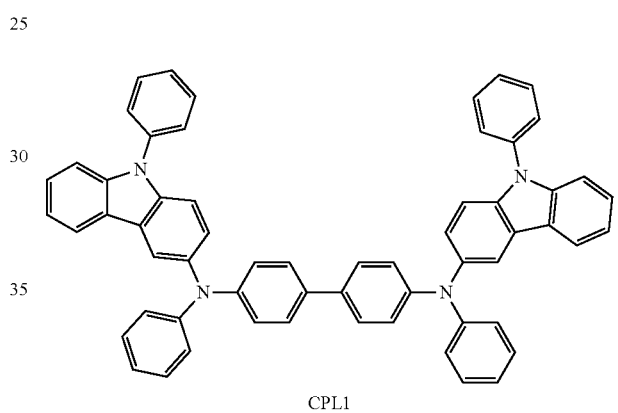

CPL1

Evaluation of Properties of Organic Electroluminescence Devices

In Table 2, the evaluation results of the organic electroluminescence devices of Example 1 to Example 12, and Comparative Example 1 to Comparative Example 12 are shown. In Table 2, the driving voltage, emission efficiency and external quantum efficiency (EQE) of the organic electroluminescence devices thus manufactured are compared.

In the property evaluation results on the Examples and Comparative Examples shown in Table 2, the voltage and current density were measured using a source meter (Keithley Instrument Co., 2400 series), and the emission efficiency was measured using an external quantum efficiency measurement apparatus, C9920-12 of Hamamatsu Photonics Co. For the evaluation of the maximum external quantum efficiency, luminance/current density was measured using a brightness photometer of which wavelength sensitivity was calibrated, and the maximum external quantum efficiency was converted by assuming angular luminance distribution (Lambertian) introducing a perfect diffusion reflecting surface. The driving voltage and emission efficiency showed current efficiency values with respect to a current density of about 10 mA/cm$^2$.

TABLE 2

| Device manufacturing example | Hole transport layer material | Emission layer host material | Emission layer dopant material | Driving voltage (V) | Emission efficiency (cd/A) |
|---|---|---|---|---|---|
| Example 1 | HT1 | mCP | Compound 1 | 5.4 | 22.3 |
| Example 2 | HT1 | mCP | Compound 6 | 5.3 | 21.9 |
| Example 3 | HT1 | mCP | Compound 14 | 5.3 | 21.2 |
| Example 4 | HT1 | mCP | Compound 22 | 5.0 | 20.4 |
| Example 5 | HT1 | Compound 27 | Compound 1 | 5.2 | 22.6 |
| Example 6 | HT1 | Compound 27 | Compound 6 | 5.2 | 22.2 |
| Example 7 | HT9 | mCP | Compound 1 | 5.7 | 18.2 |
| Example 8 | HT9 | mCP | Compound 6 | 5.6 | 17.7 |
| Example 9 | HT9 | mCP | Compound 14 | 5.6 | 16.4 |
| Example 10 | HT9 | mCP | Compound 22 | 5.4 | 16.7 |
| Example 11 | HT9 | Compound 27 | Compound 1 | 5.7 | 18.1 |
| Example 12 | HT9 | Compound 27 | Compound 6 | 5.6 | 17.8 |
| Comparative Example 1 | HT1 | mCP | Comparative Compound C1 | 5.8 | 15.4 |
| Comparative Example 2 | TcTa | mCP | Comparative Compound C2 | 6.1 | 16.4 |
| Comparative Example 3 | TcTa | mCP | Comparative Compound C3 | 6.5 | 16.8 |
| Comparative Example 4 | TcTa | mCP | Comparative Compound C4 | 5.6 | 17.7 |
| Comparative Example 5 | TcTa | mCP | Comparative Compound C5 | 5.9 | 17.1 |

Referring to the results of Table 2, it can be seen that the Examples of the organic electroluminescence devices using the fused polycyclic compounds according to embodiments of the present disclosure as the materials of an emission layer showed lower driving voltage values and relatively higher emission efficiency when compared with the Comparative Examples. The Example Compounds show TADF properties using multiple resonance phenomenon due to aromatic rings forming a fused ring, including three or four boron atoms, and include a structure in which seven aromatic rings are connected via three or four boron atoms and five heteroatoms, and may show multiple resonance in a wide plate-type skeleton when compared with Comparative Compound C1. Accordingly, the organic electroluminescence devices of the Examples may show improved emission efficiency when compared with the organic electroluminescence devices of the Comparative Examples.

In Comparative Compound C2, aromatic rings forming a fused cycle are included, but two boron atoms are included, and multiple resonance effects due to a plate-type skeleton are reduced when compared with the Example Compounds. Accordingly, it can be seen that the device of Comparative Example 2 including Comparative Compound C2 as an emission layer dopant showed an increased driving voltage and reduced emission efficiency when compared with the devices of the Examples.

In Comparative Compound C3 to Comparative Compound C5, aromatic rings forming a fused ring and three or more boron atoms are included, but different from the present disclosure, seven aromatic rings do not have an optimized structure connected via three or four boron atoms and five heteroatoms, and multiple resonance effects were reduced when compared with the Example Compounds. Accordingly, it can be seen that the devices of Comparative Example 3 to Comparative Example 5 including Comparative Compound C3 to Comparative Compound C5 as the emission layer dopants showed increased driving voltages and reduced emission efficiency when compared with the devices of the Examples.

The fused polycyclic compound of an embodiment includes a structure in which seven aromatic rings are connected via three or four boron atoms and five heteroatoms, has a high oscillator strength value and a small $\Delta E_{ST}$ value, and may be used as a material for emitting delayed fluorescence. In addition, the fused polycyclic compound of an embodiment may be used as the dopant material of the emission layer of an organic electroluminescence device and may improve device efficiency.

The organic electroluminescence device of an embodiment includes the fused polycyclic compound of an embodiment and may show improved emission efficiency. In addition, the organic electroluminescence device of an embodiment includes the fused polycyclic compound of an embodiment as a material for an emission layer and may accomplish high emission efficiency in a blue light wavelength region.

The organic electroluminescence device of an embodiment may show improved device characteristics with a low driving voltage and high efficiency.

The fused polycyclic compound of an embodiment may be included in the emission layer of an organic electroluminescence device and may contribute to increasing the efficiency of the organic electroluminescence device.

Although exemplary embodiments of the present disclosure have been described herein, it is understood that the present disclosure should not be limited to these exemplary embodiments but various changes and modifications can be made by one ordinary skilled in the art within the spirit and scope of the present disclosure as hereinafter claimed.

What is claimed is:

1. An organic electroluminescence device, comprising:
    a first electrode;
    a second electrode facing the first electrode; and
    a plurality of organic layers between the first electrode and the second electrode,
    wherein at least one organic layer among the plurality of organic layers comprises a fused polycyclic compound represented by the following Formula 1, and at least one organic layer among the plurality of organic layers comprises an amine compound represented by the following Formula a:

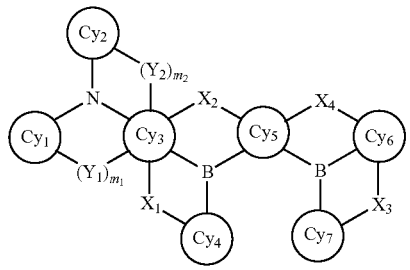

Formula 1 wherein, in Formula 1, $Cy_1$ to $Cy_7$ are each independently a substituted or unsubstituted aromatic hydrocarbon ring, or a substituted or unsubstituted aromatic heterocycle, $X_1$ to $X_4$ are each independently $NR_a$, O or S, $R_a$ is a substituted or unsubstituted alkyl group of 1 to 20 carbon atom, a substituted or unsubstituted aryl group of 6 to 60 ring-forming carbon atoms, or a substituted or unsubstituted heteroaryl group of 2 to 60 ring-forming carbon atoms, $Y_1$ and $Y_2$ are each independently $BAr_1$, $Ar_1$ is a substituted or unsubstituted aryl group of 6 to 60 ring-forming carbon atoms, or a substituted or unsubstituted heteroaryl group of 2 to 60 ring-forming carbon atoms, and $m_1$ and $m_2$ are each independently 0 or 1, where at least one selected from among $m_1$ and $m_2$ is 1,

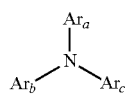

Formula a wherein, in Formula a, $Ar_a$ to $Ar_c$ are each independently a substituted or unsubstituted aryl group of 6 to 60 ring-forming carbon atoms, or a substituted or unsubstituted heteroaryl group of 2 to 60 ring-forming carbon atoms.

2. The organic electroluminescence device of claim 1, wherein the plurality of organic layers comprise:

a hole transport region on the first electrode;

an emission layer on the hole transport region; and an electron transport region on the emission layer, and the emission layer comprises the fused polycyclic compound represented by Formula 1 above.

3. The organic electroluminescence device of claim 2, wherein the emission layer emits delayed fluorescence.

4. The organic electroluminescence device of claim 2, wherein the emission layer is a delayed fluorescence emission layer comprising a host and a dopant, and the dopant comprises the fused polycyclic compound represented by Formula 1 above.

5. The organic electroluminescence device of claim 2, wherein the hole transport region comprises:

a hole injection layer on the first electrode; and a hole transport layer on the hole injection layer, and the hole transport layer comprises the amine compound represented by Formula a above.

6. The organic electroluminescence device of claim 1, wherein the emission layer is a delayed fluorescence emission layer comprising a host and a dopant, and the host comprises the fused polycyclic compound represented by Formula 1 above.

7. The organic electroluminescence device of claim 1, further comprising a capping layer on the second electrode, the capping layer having a refractive index of about 1.6 or more.

8. The organic electroluminescence device of claim 1, wherein the fused polycyclic compound represented by Formula 1 above is represented by the following Formula 2:

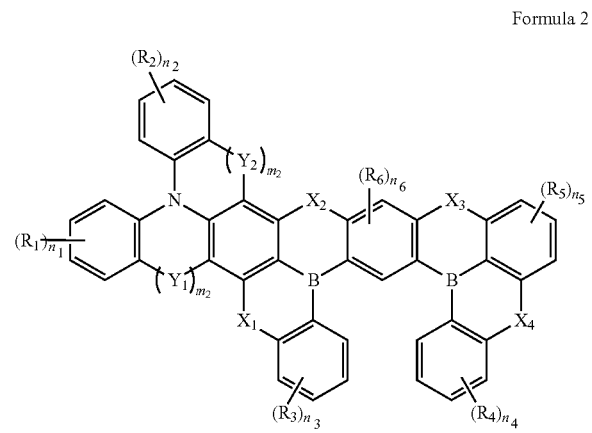

Formula 2 wherein, in Formula 2, $R_1$ to $R_6$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring, $n_1$ to $n_4$ are each independently an integer in a range of 0 to 4, $n_5$ is an integer in a range of 0 to 3, $n_6$ is an integer in a range of 0 to 2, and $X_1$ to $X_4$, $Y_1$, $Y_2$, $R_a$, $Ar_1$ $m_1$ and $m_2$ are the same as defined in Formula 1.

9. The organic electroluminescence device of claim 8, wherein the fused polycyclic compound represented by Formula 1 above is represented by the following Formula 3-1 to Formula 3-3:

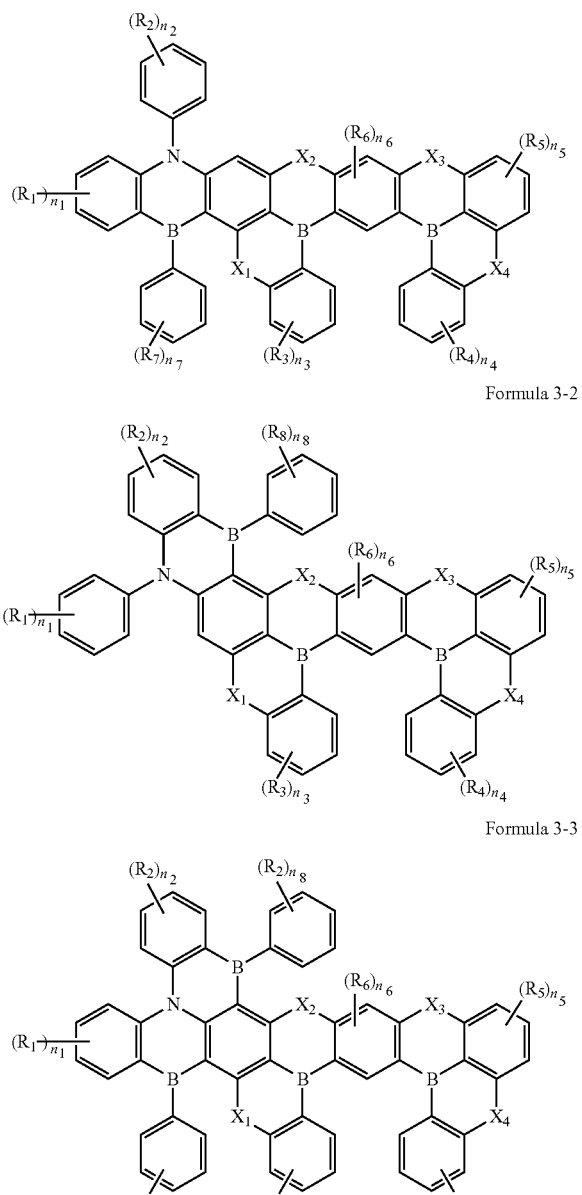

Formula 3-1

Formula 3-2

Formula 3-3 wherein, in Formula 3-1 to Formula 3-3, $R_7$ and $R_8$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring, $n_7$ and $n_8$ are each independently an integer in a range of 0 to 5, and $X_1$ to $X_4$, $R_a$, $R_1$ to $R_6$, and $n_1$ to $n_6$ are the same as defined in Formula 1 and Formula 2.

10. The organic electroluminescence device of claim 8, wherein the fused polycyclic compound represented by Formula 1 above is represented by the following Formula 4-1 to Formula 4-6:

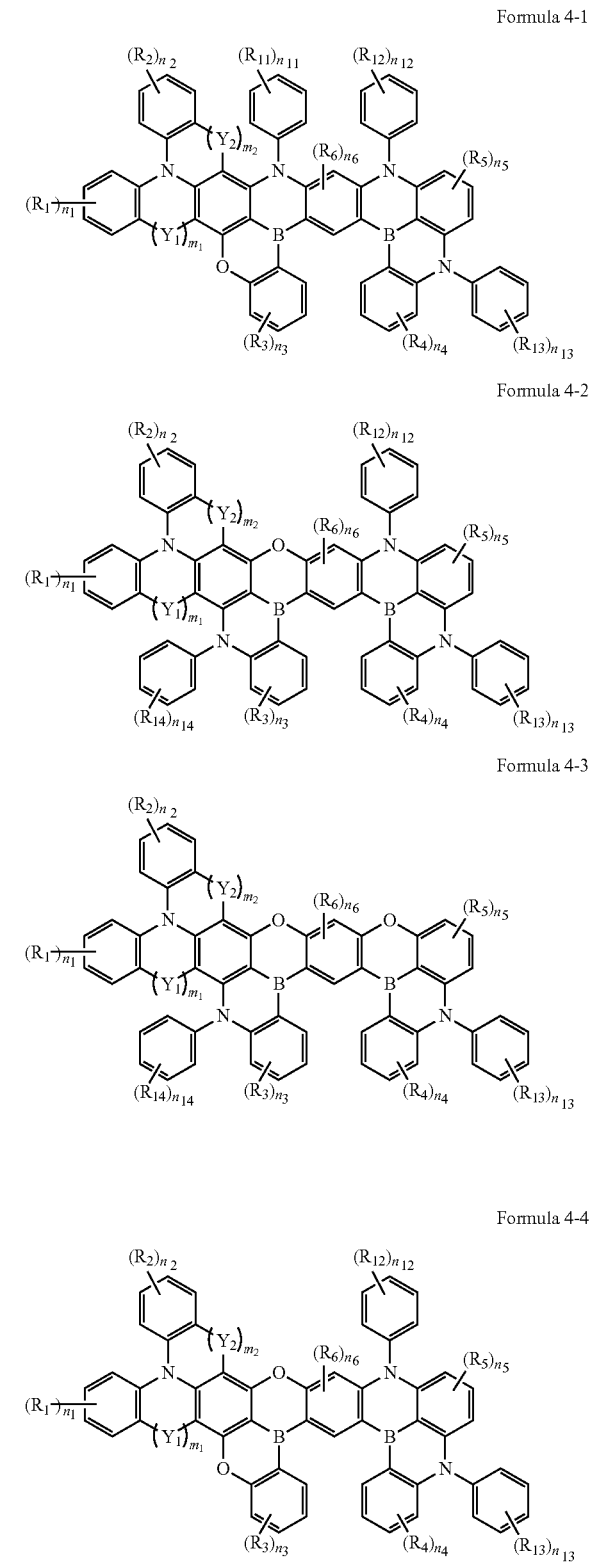

Formula 4-1

Formula 4-2

Formula 4-3

Formula 4-4

-continued

Formula 4-5

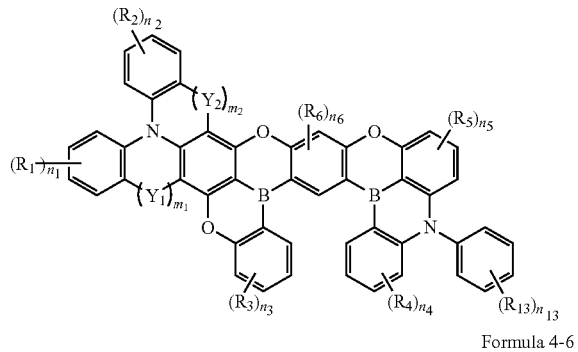

Formula 4-6

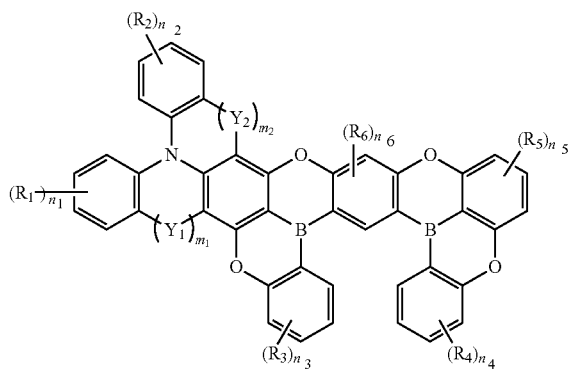

wherein, in Formula 4-1 to 4-6, $R_{11}$ to $R_{14}$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring, $n_{11}$ to $n_1$ are each independently an integer in a range of 0 to 5, and $Y_1, Y_2, Ar_1, R_1$ to $R_6, m_1, m_2$ and $n_1$ to $n_6$ are the same as defined in Formula 1 and Formula 2.

11. The organic electroluminescence device of claim 8, wherein the fused polycyclic compound represented by Formula 1 above is represented by the following Formula 5:

Formula 5

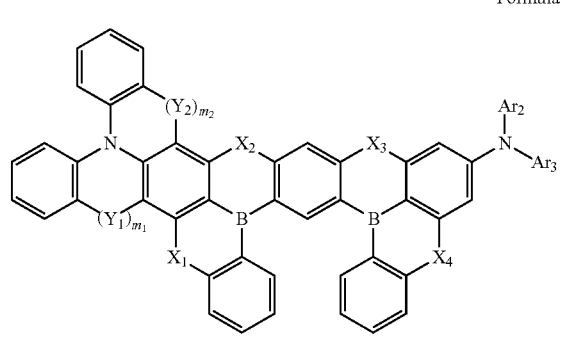

wherein, in Formula 5, $Ar_2$ and $Ar_3$ are each independently a substituted or unsubstituted aryl group of 6 to 60 ring-forming carbon atoms, or a substituted or unsubstituted heteroaryl group of 2 to 60 ring-forming carbon atoms, and $X_1$ to $X_4$, $R_a$, $Y_1$, $Y_2$, $Ar_1$, $m_1$ and $m_2$ are the same as defined in Formula 1 and Formula 2.

12. The organic electroluminescence device of claim 1, wherein in Formula 1, when $X_1$ to $X_4$ are each independently $NR_a$, $R_a$ is a substituted or unsubstituted phenyl group.

13. The organic electroluminescence device of claim 1, wherein in Formula 1, $Ar_1$ is a substituted or unsubstituted phenyl group.

14. The organic electroluminescence device of claim 1, wherein in Formula 1, when $m_1$ is 1, $X_1$ is O or S, and when $m_2$ is 1, $X_2$ is O or S.

15. The organic electroluminescence device of claim 1, wherein the fused polycyclic compound comprises at least one selected from among compounds represented in the following Compound Group 1:

[Compound Group 1]

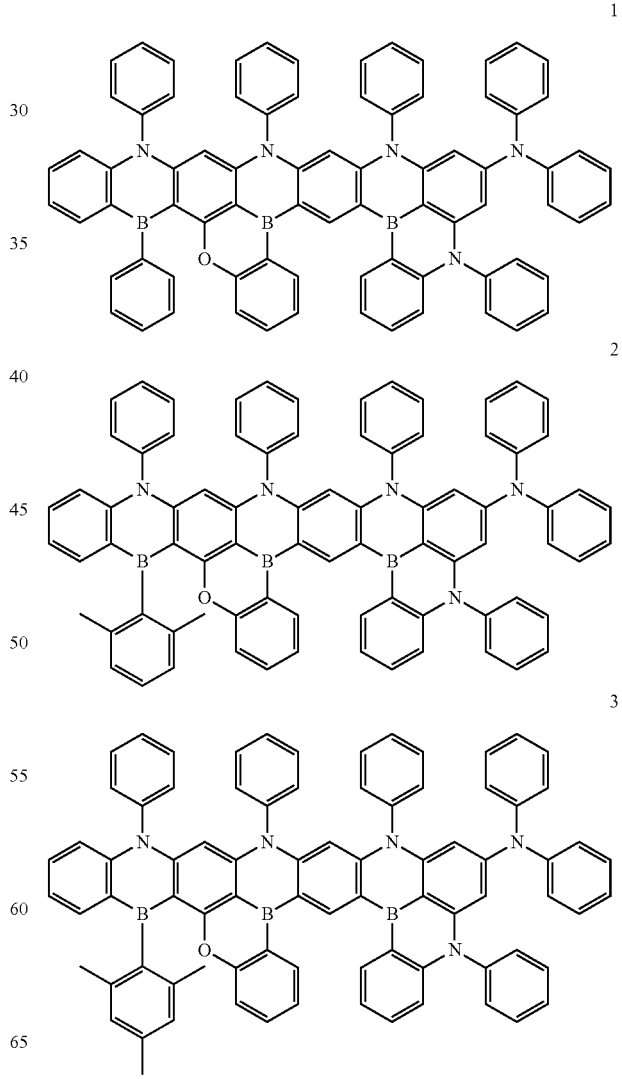

4
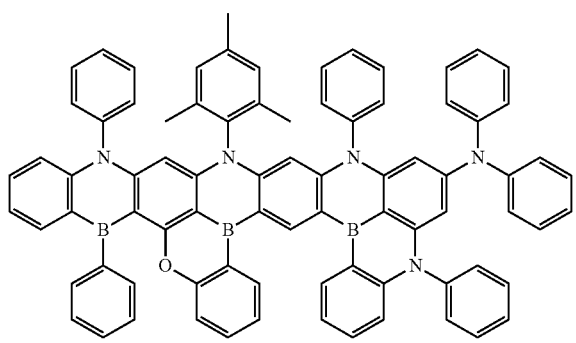
5
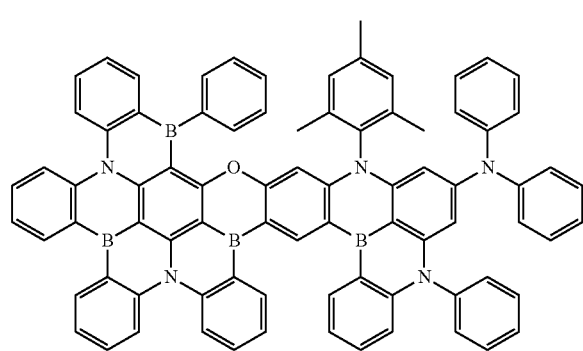
6
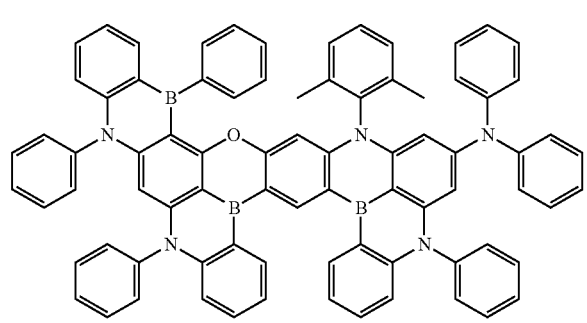
7
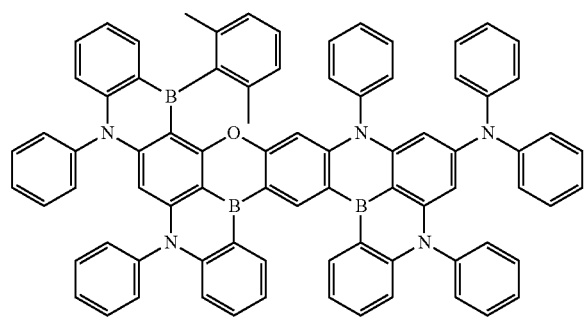
8
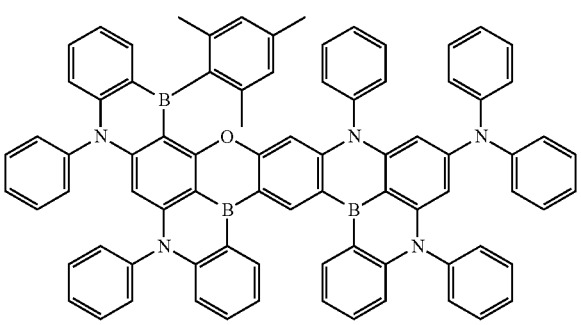
9
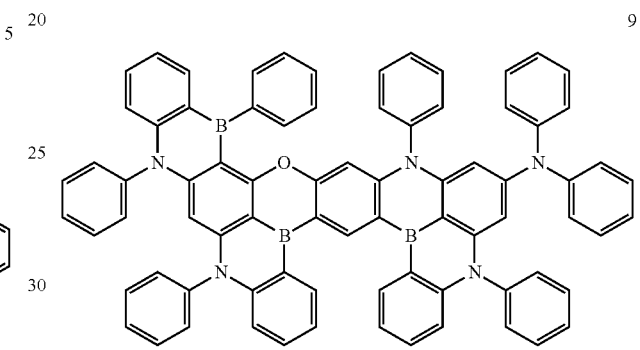
10
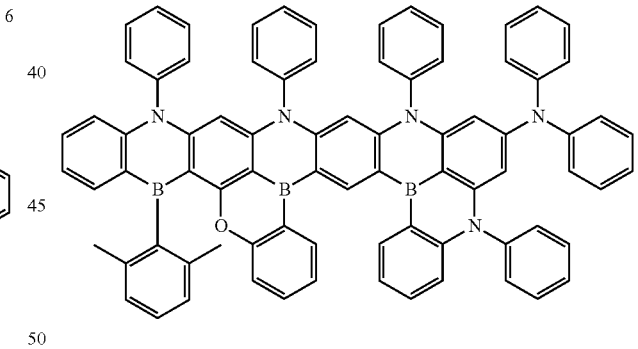
11
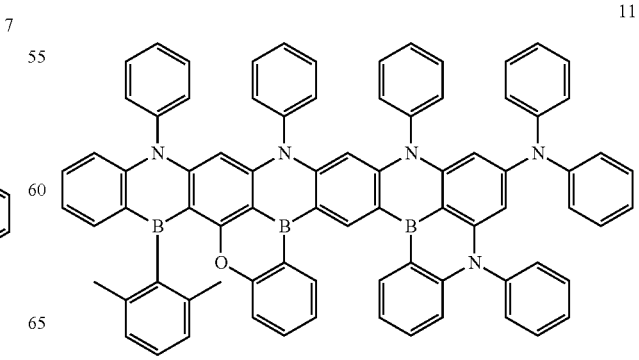

12
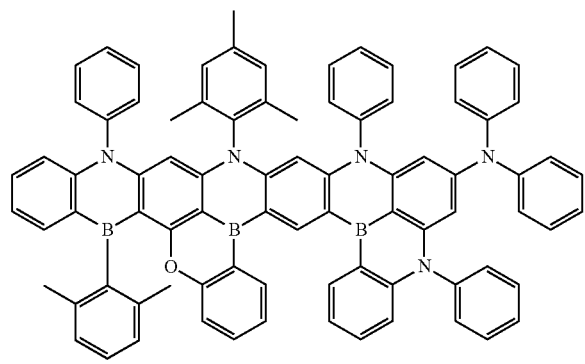
13
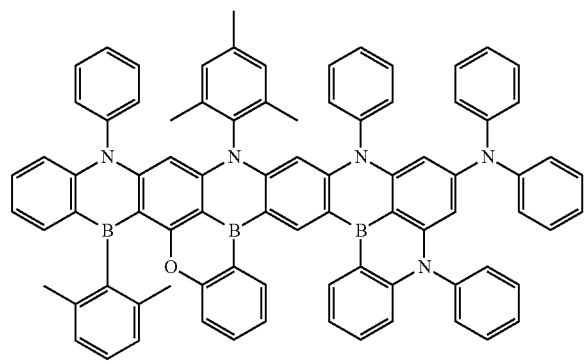
14
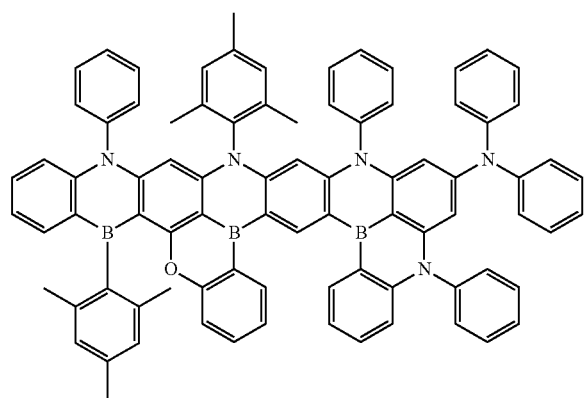
15
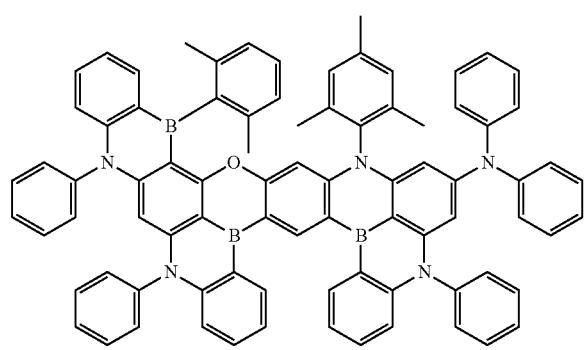
16
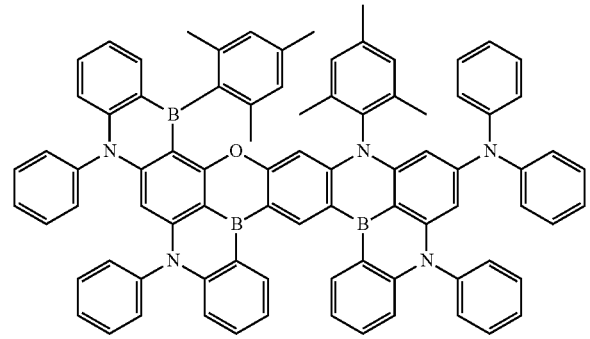
17
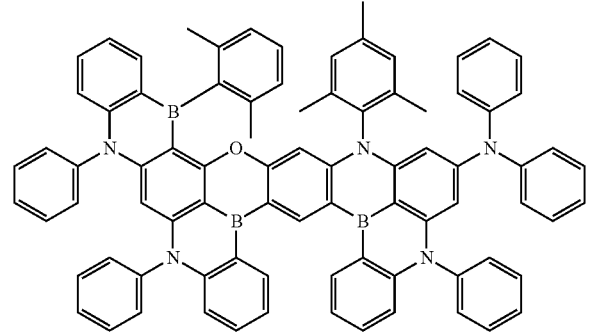
18
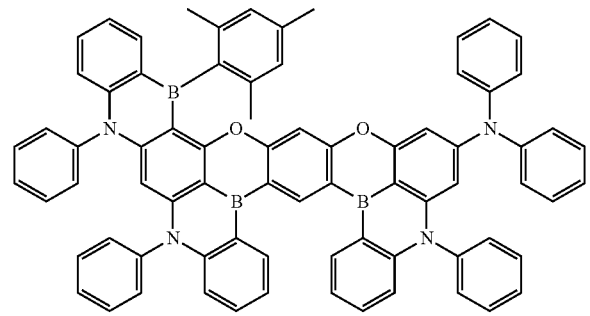
19
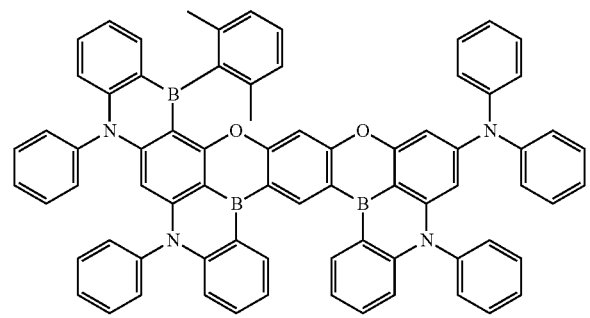

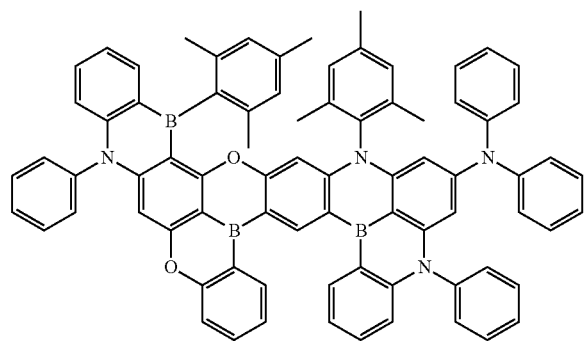

20

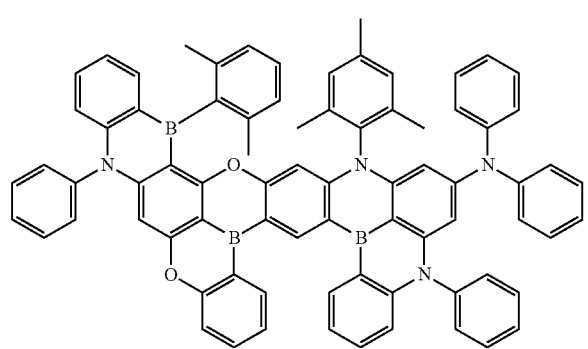

21

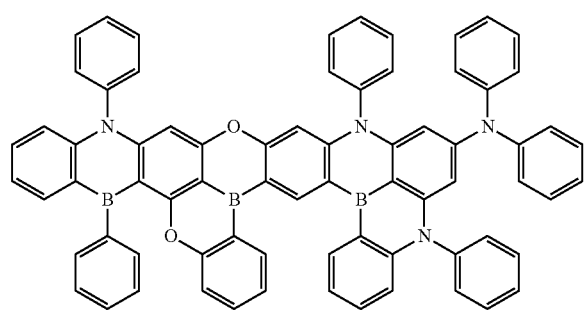

22

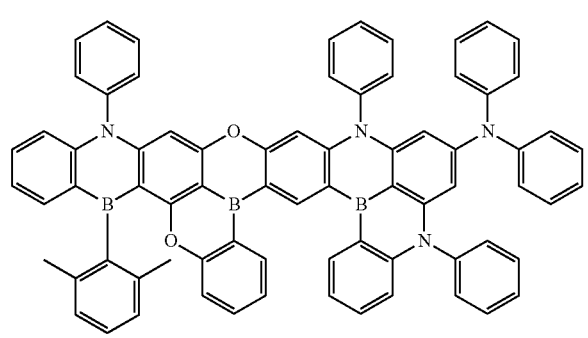

23

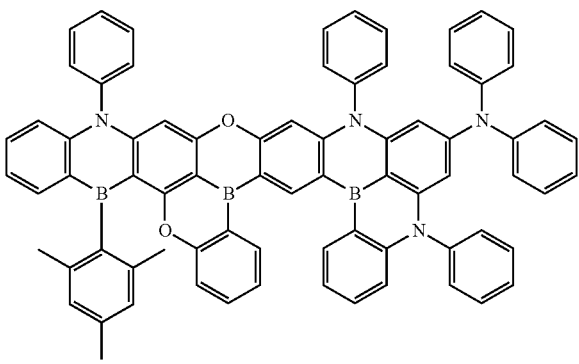

24

25

26

27

16. An organic electroluminescence device comprising:
a first electrode;
a second electrode facing the first electrode; and
a plurality of organic layers between the first electrode and the second electrode,
wherein at least one organic layer among the plurality of organic layers comprises:
a first fused polycyclic compound represented by the following Formula 1, and a second fused polycyclic compound represented by the following Formula 1, the second fused polycyclic compound being different from the first fused polycyclic compound:

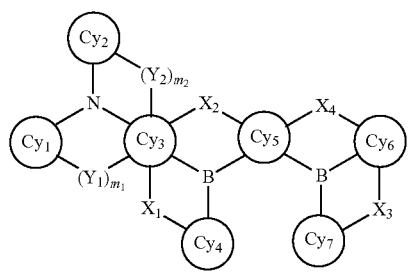

Formula [1]

wherein, in Formula 1,
$Cy_1$ to $Cy_7$ are each independently a substituted or unsubstituted aromatic hydrocarbon ring, or a substituted or unsubstituted aromatic heterocycle,
$X_1$ to $X_4$ are each independently $NR_a$, O or S,
$R_a$ is a substituted or unsubstituted alkyl group of 1 to 20 carbon atom, a substituted or unsubstituted aryl group of 6 to 60 ring-forming carbon atoms, or a substituted or unsubstituted heteroaryl group of 2 to 60 ring-forming carbon atoms,
$Y_1$ and $Y_2$ are each independently $BAr_1$,
$Ar_1$ is a substituted or unsubstituted aryl group of 6 to 60 ring-forming carbon atoms, or a substituted or unsubstituted heteroaryl group of 2 to 60 ring-forming carbon atoms, and
$m_1$ and $m_2$ are each independently 0 or 1, where at least one selected from among $m_1$ and $m_2$ is 1.

17. The organic electroluminescence device of claim 16, wherein the plurality of organic layers comprise:
a hole transport region on the first electrode;
an emission layer on the hole transport region; and
an electron transport region on the emission layer, and
the emission layer comprises the first fused polycyclic compound and the second fused polycyclic compound.

18. The organic electroluminescence device of claim 17, wherein the emission layer is a delayed fluorescence emission layer comprising a host and a dopant,
the host comprises the first fused polycyclic compound, and the dopant comprises the second fused polycyclic compound.

19. The organic electroluminescence device of claim 16, wherein the fused polycyclic compound represented by Formula 1 above is represented by the following Formula 2:

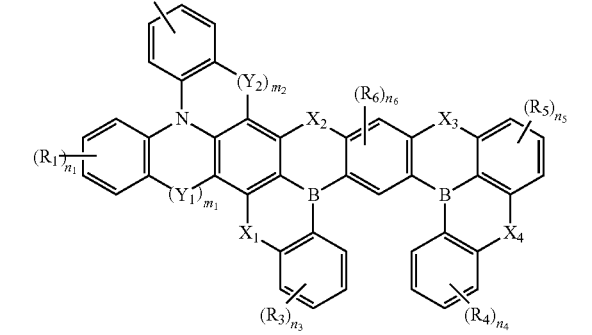

Formula 2 wherein, in Formula 2,
$R_1$ to $R_6$ are each independently a hydrogen atom, a deuterium atom, a halogen atom, a phosphine oxide group, a cyano group, a substituted or unsubstituted amine group, a substituted or unsubstituted silyl group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, or combined with an adjacent group to form a ring,
$n_1$ to $n_4$ are each independently an integer in a range of 0 to 4,
$n_5$ is an integer in a range of 0 to 3,
$n_6$ is an integer in a range of 0 to 2, and
$X_1$ to $X_4$, $Y_1$, $Y_2$, $R_a$, $Ar_1$, $m_1$ and $m_2$ are the same as defined in Formula 1.

20. The organic electroluminescence device of claim 16, wherein the fused polycyclic compound represented by Formula 1 above has an absolute value of a difference between the lowest singlet excitation energy level (S1) and the lowest triplet excitation energy level (T1) of about 0.33 eV or less.

* * * * *